United States Patent
Harada et al.

(10) Patent No.: US 9,613,970 B2
(45) Date of Patent: Apr. 4, 2017

(54) SEMICONDUCTOR NONVOLATILE MEMORY ELEMENT

(71) Applicant: SII Semiconductor Corporation, Chiba-shi, Chiba (JP)

(72) Inventors: Hirofumi Harada, Chiba (JP); Shinjiro Kato, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/013,540

(22) Filed: Feb. 2, 2016

(65) Prior Publication Data

US 2016/0225779 A1  Aug. 4, 2016

(30) Foreign Application Priority Data

Feb. 3, 2015 (JP) .................................. 2015-019469
Feb. 4, 2015 (JP) .................................. 2015-020600
Sep. 30, 2015 (JP) .................................. 2015-194571

(51) Int. Cl.
*H01L 29/768* (2006.01)
*H01L 27/11521* (2017.01)
*H01L 21/762* (2006.01)
*H01L 29/66* (2006.01)

(52) U.S. Cl.
CPC .. *H01L 27/11521* (2013.01); *H01L 21/76202* (2013.01); *H01L 29/66825* (2013.01)

(58) Field of Classification Search
CPC ..................... H01L 27/11521; H01L 27/11518
See application file for complete search history.

(56) References Cited

U.S. PATENT DOCUMENTS

2004/0047203 A1* 3/2004 Lee .................... G11C 16/0408
                                                    365/202
2009/0184346 A1* 7/2009 Jain ....................... B82Y 10/00
                                                    257/288

OTHER PUBLICATIONS

Abstract, Publication No. 2008-198775, Publication date Aug. 28, 2008.

* cited by examiner

*Primary Examiner* — Dung Le
(74) *Attorney, Agent, or Firm* — Adams & Wilks

(57) ABSTRACT

A semiconductor nonvolatile memory element is used to form a constant current source in a semiconductor integrated circuit device. The semiconductor nonvolatile memory element includes a control gate electrode, a floating gate electrode, source/drain terminals, a thin first gate insulating film, and a second gate insulating film that is thick enough not to be broken down even when a voltage higher than an operating voltage of the semiconductor integrated circuit device is applied thereto, the first and second gate insulating films being formed below the control gate electrode. Thus, provided is a normally on type semiconductor nonvolatile memory element in which a threshold voltage can be regulated through injection of a large amount of charge with respect to the operating voltage from a drain terminal into the floating gate electrode via the second gate insulating film, and injected carriers do not leak in an operating voltage range.

5 Claims, 41 Drawing Sheets

(6)

SEMICONDUCTOR NONVOLATILE MEMORY ELEMENT

BACKGROUND OF THE INVENTION

1. Field of the Invention

The present invention relates to a semiconductor nonvolatile memory element that can change a threshold voltage through an externally applied electrical signal and a manufacturing method thereof.

2. Description of the Related Art

An electronic circuit used in electronic equipment is driven by a power supply such as a battery. When a voltage of the power supply fluctuates, malfunction of the electronic circuit and various abnormal phenomena may be caused. Thus, it is a typical approach to place a power management IC between the electronic circuit and the power supply, which is configured to regulate the voltage so that a constant voltage is output or monitoring fluctuations of the power supply, to thereby promote stable operation. In particular, in a semiconductor integrated circuit device such as a microcomputer or a CPU that is operated at increasingly lower voltages in recent years, the power management IC has been strongly required to output an accurate constant voltage and to accurately monitor the voltage value.

Exemplary power management ICs configured such that a constant voltage is output from a power supply to an electronic circuit include a step-down series regulator as illustrated in FIG. 3.

In this semiconductor integrated circuit device, a power supply voltage that is applied between a ground terminal 105 and a power supply terminal 106 is divided by a PMOS output element 104 and a voltage dividing circuit 103 including resistance elements 102. The voltage divided by the resistance elements 102 is input to a minus input terminal of an error amplifier 101, and is compared to a certain reference voltage value generated by a reference voltage circuit 100. Depending on a result of the comparison, the error amplifier 101 controls an input voltage of the PMOS output element 104 to change a source-drain resistance of the PMOS output element 104. As a result, an output terminal 107 has the function of outputting a constant output voltage that does not depend on the power supply voltage, but depends on the reference voltage value of the reference voltage circuit 100 and a resistance divided voltage ratio of the voltage dividing circuit 103. The output voltage is calculated by the following Expression (1):

$$\text{(Output voltage)}=\text{(reference voltage value)}\times\text{(resistance divided voltage ratio of voltage dividing circuit)} \quad (1)$$

In regulating the output voltage, by changing a resistance value of the resistance element 102 in a method described below, the divided voltage ratio of the voltage dividing circuit 103 is changed to set the output voltage value at a desired value based on Expression (1). Accordingly, the voltage dividing circuit of the semiconductor integrated circuit is required to be processed/corrected for each target output voltage.

Further, a voltage detector as illustrated in FIG. 4 that has the function of outputting a signal when the power supply voltage becomes a constant voltage is also one kind of the power management IC.

In this semiconductor integrated circuit device, the power supply voltage that is input from the power supply terminal 106 is converted to a voltage divided by the voltage dividing circuit 103 that includes the resistance elements 102, and the converted voltage is compared to the reference voltage value of the reference voltage circuit 100 by a comparator 108. A voltage signal corresponding to a result of the comparison is output from the output terminal 107. With this mechanism, a voltage detector is realized that has the function of monitoring the power supply voltage and outputting, when the voltage becomes equal to or higher than, or, equal to or lower than a certain voltage, a signal for the purpose of performing appropriate processing.

Also in the example illustrated in FIG. 4, by changing the resistance value of the resistance element 102, the divided voltage ratio of the voltage dividing circuit 103 is changed to set a desired voltage detection value based on Expression (1). Accordingly, the voltage dividing circuit of the semiconductor integrated circuit device is required to be processed/corrected for each target output voltage.

As a resistance element that is used for a voltage dividing circuit of a semiconductor integrated circuit device, a diffused resistor that is a monocrystalline silicon semiconductor substrate implanted with impurities having a conductivity type opposite to that of the semiconductor substrate, a resistor formed of polycrystalline silicon implanted with impurities, or the like is used. In designing the voltage dividing circuit, when a plurality of resistors are used, the resistors are set so as to have the same length, the same width, and the same resistivity. Then, the respective resistance elements are equally subjected to variations in shape in an etching process in which the shape is determined and to variations in impurity implantation. Accordingly, even if the absolute values of the resistance elements vary, resistance ratios between the resistance elements can be maintained at a constant value.

FIG. 5 is an illustration of a case in which the resistance elements having a certain resistance value based on the same shape and the same resistivity are used in a voltage dividing circuit. Various resistance values are realized through series connection and parallel connection of unit resistance elements 200 such as resistor groups 201 to 204 in FIG. 5. As described above, the unit resistance elements 200 are resistance elements having the same shape and the same resistivity, and thus, the high resistance ratios between the resistor groups each including the unit resistance element(s) having the high resistance ratio can be maintained with high accuracy.

Further, fuses 301 to 304 of, for example, polycrystalline silicon, are formed in parallel with the resistor groups 201 to 204, respectively, so as to be cut by laser radiation from the outside. Depending on whether or not the fuses are cut by the laser radiation, a resistance value between a terminal 109 and a terminal 110 can be changed as necessary. Then, a voltage corresponding to a divided voltage ratio to a fixed resistor formed between the terminal 110 and a terminal 111 is output from the terminal 110.

In the voltage dividing circuit as described above that has a highly accurate resistance ratio, by cutting the polycrystalline silicon fuse(s) with a laser, a desired divided voltage ratio can be obtained with high accuracy, and products having various target output voltages can be manufactured using the same semiconductor integrated circuit device.

A typical method of regulating an output voltage is as illustrated in FIG. 2.

First, an output voltage of a product completed in a semiconductor processing factory is measured as it is ((1) in FIG. 2). Then, based on a computational expression or a database prepared in advance depending on the output voltage, the polycrystalline silicon fuses formed in the voltage dividing circuit are processed with a laser to trim the output voltage ((2) in FIG. 2). Finally, the output voltage of the processed product is measured again to see whether or not the product is within specification as desired ((3) in FIG. 2). If the product is out of specification, the product is not shipped. Other than this, there is an online trimming method in which the resistors are gradually processed while the output voltage is monitored, and the processing is stopped when the output voltage reaches a desired value. The method illustrated in FIG. 2 is called an off line trimming method in contrast with the online trimming method.

Next, a reference voltage circuit that is used similarly in the circuits illustrated in FIG. 3 and FIG. 4 is described with reference to FIG. 6A and FIG. 6B.

A most basic related-art reference voltage circuit includes a depression type NMOS transistor 402 and an enhancement type NMOS transistor 401. As illustrated in FIG. 6A, each of the transistors is formed on a P-type well region 5 in a semiconductor substrate 1, and includes a gate electrode 6, a gate insulating film 9, and an N-type source/drain region 12. The transistors are different from each other in that, as an impurity region for determining a threshold voltage that is formed under the gate insulating film 9, an N-channel impurity region 10 is formed with regard to the depression type NMOS transistor 402 while a P-channel impurity region 11 is formed with regard to the enhancement type NMOS transistor 401. Further, each of the transistors includes a drain terminal 2 and a source terminal 3 for controlling operation thereof, and a body terminal 4 for fixing a potential of the P-type well region.

By connecting in series the depression type NMOS transistor 402 and the enhancement type NMOS transistor 401 between a power supply terminal 403 and a ground terminal 404 as illustrated in FIG. 6B, outputting a constant current from the depression type NMOS transistor 402 as a current source, and inputting the current to the drain terminal 2 of the enhancement type NMOS transistor 401 as a load element, a voltage generated at the drain terminal of the enhancement type NMOS transistor 401 that is a constant voltage is output to a reference voltage output terminal 405 (see, for example, Japanese Patent Application Laid-open No. 2008-198775).

The constant voltage that is output from the reference voltage circuit in this case is as expressed by the following Expression (2):

$$\text{(Reference voltage circuit constant voltage)} = \sqrt{(Ktd/Kte)} \times |Vtd| + Vte \quad (2),$$

where Vtd and Ktd are a threshold voltage and a transconductance, respectively, of the depression type NMOS transistor, and Vte and Kte are a threshold voltage and a transconductance, respectively, of the enhancement type NMOS transistor.

In other words, variations in output voltage in Expression (1) arise from variations in parameters that determine the constant voltage that is output from the reference voltage circuit. The variations are absorbed through regulation of the resistance divided voltage ratio of the voltage dividing circuit.

SUMMARY OF THE INVENTION

Provided are a semiconductor nonvolatile memory element enabling regulation of a threshold voltage with high accuracy, the semiconductor nonvolatile memory element being capable of regulating an output voltage without employing any trimming method using laser processing in order to reduce variations in circuit characteristics of a semiconductor integrated circuit device, and a manufacturing method thereof.

In order to solve the problem described above, the present invention has the following configuration.

That is, according to one embodiment of the present invention, there is provided a semiconductor nonvolatile memory element, including: a semiconductor substrate; a well region of a first conductivity type formed in the semiconductor substrate; a heavily doped source region and a first heavily doped drain region which are formed so as to be apart from each other, and each of which contains high-concentration impurities of a second conductivity type; a first gate insulating film formed on the semiconductor substrate between the heavily doped source region and the first heavily doped drain region so as to be adjacent to the heavily doped source region; a second gate insulating film formed on the semiconductor substrate between the heavily doped source region and the first heavily doped drain region so as to be adjacent to the first heavily doped drain region; a second heavily doped drain region of the second conductivity type formed apart from the heavily doped source region, the second heavily doped drain region including a region under the second gate insulating film and being formed in a region that overlaps the first heavily doped drain region; a first lightly doped drain region of the second conductivity type formed apart from the heavily doped source region, the first lightly doped drain region including a region under the first gate insulating film and the region under the second gate insulating film and being formed in a region that overlaps the first heavily doped drain region and the second heavily doped drain region; a channel impurity region of the second conductivity type formed under the first gate insulating film between the heavily doped source region and the first lightly doped drain region; a floating gate electrode that is made of polycrystalline silicon containing high-concentration impurities and is formed on the first gate insulating film and the second gate insulating film; a third gate insulating film formed on the floating gate electrode; and a control gate electrode that is made of polycrystalline silicon containing high-concentration impurities, and is formed on the third gate insulating film, in which the well region of the first conductivity type includes the heavily doped source region, the first heavily doped drain region, the second heavily doped drain region, the first lightly doped drain region, and the channel impurity region, and is formed to a depth that is larger than depths of the heavily doped source region, the first heavily doped drain region, the second heavily doped drain region, the first lightly doped drain region, and the channel impurity region.

Further, in order to solve the problem described above, the present invention employs the following method.

That is, according to one embodiment of the present invention, there is provided a method of manufacturing a semiconductor nonvolatile memory element, including:

a P-type well region forming step of forming, in a semiconductor substrate, a P-type well region containing P-type impurities;

an element isolation insulating film forming step of forming a LOCOS oxide film around the P-type well region;

an N-type heavily doped impurity region forming step of forming, in a region in which a drain is to be formed, an N-type heavily doped impurity region containing N-type impurities;

an N-type lightly doped impurity region forming step of forming a first N-type lightly doped impurity region at an N-type impurity concentration that is lower than an N-type impurity concentration of the N-type heavily doped impurity region to a depth that is larger than a depth of the N-type heavily doped impurity region;

a channel region forming step of forming an N-type impurity region in a region in which a channel is to be formed in the P-type well region;

a gate insulating film forming step of forming a second gate insulating film in the region in which the drain is to be formed so as to overlap the N-type heavily doped impurity region, and forming a first gate insulating film that is thinner than the second gate insulating film in the region in which the channel is to be formed;

a gate electrode forming step of forming, on the first gate insulating film and on the second gate insulating film, a polycrystalline silicon layer that contains impurities, forming a third gate insulating film on the polycrystalline silicon layer, and forming, on the third gate insulating film, a polycrystalline silicon layer that contains impurities; and a source/drain forming step of forming N-type impurity regions in a region in which a source is to be formed and in the region in which the drain is to be formed, respectively.

According to the one embodiment of the present invention, the semiconductor nonvolatile memory element enabling regulation of a threshold voltage with an external electrical signal can be provided, and an output voltage of a semiconductor integrated circuit device can be regulated with high accuracy and with ease.

DETAILED DESCRIPTION OF THE INVENTION

Now, embodiments of the present invention are described with reference to the attached drawings.

Figure 3:
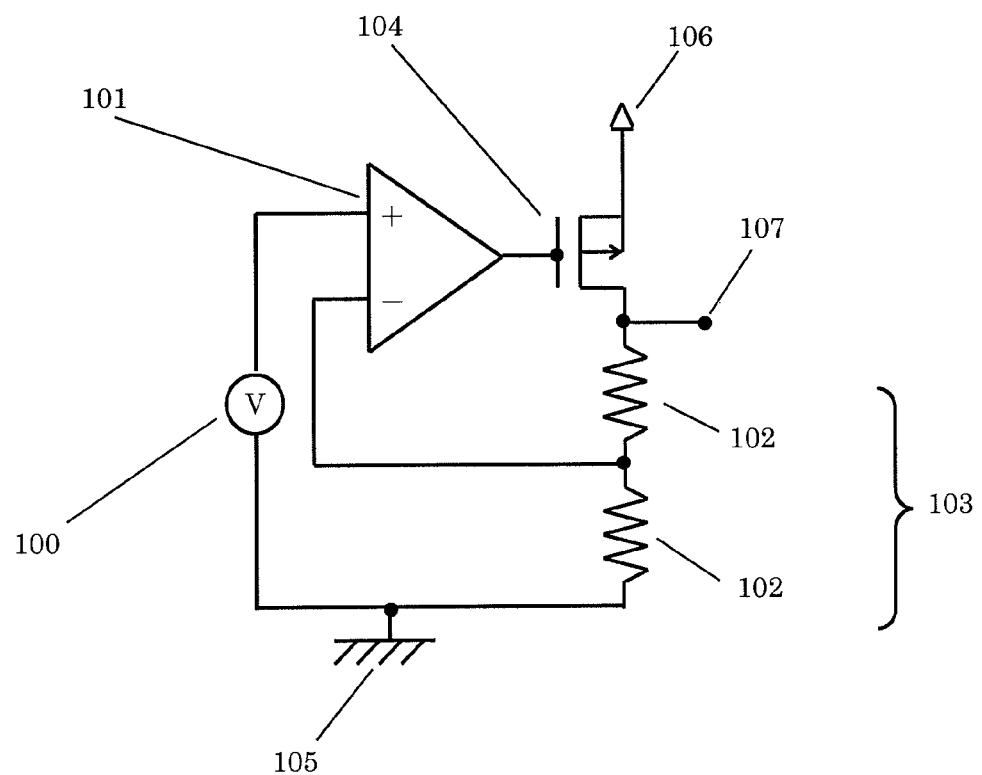
FIG. 3 is a schematic circuit diagram of a step-down series regulator of the related-art semiconductor integrated circuit device.
Figure 8:
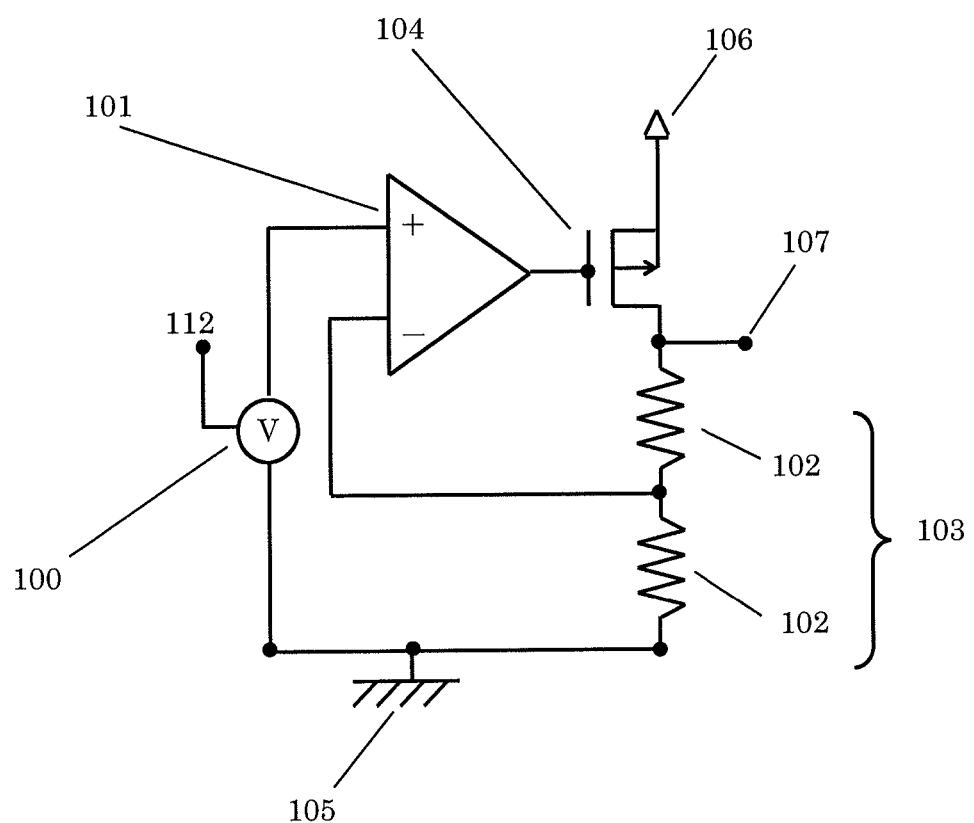
FIG. 8 is a schematic circuit diagram of a step-down series regulator of the semiconductor integrated circuit device according to the present invention.
Figure 9:
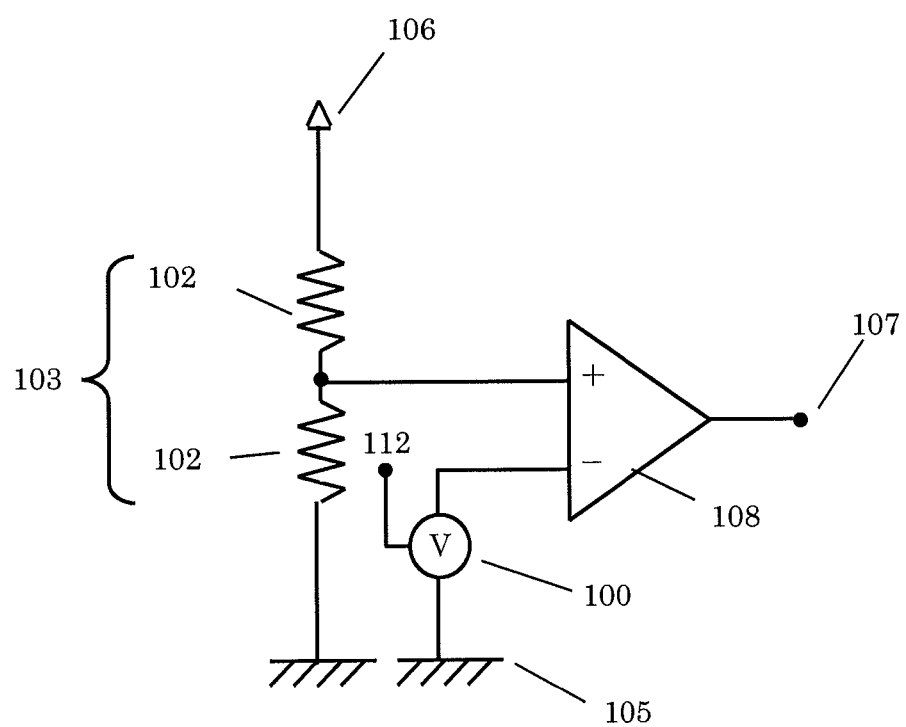
FIG. 9 is a schematic circuit diagram of a voltage detector of the semiconductor integrated circuit device according to the present invention.

First, an embodiment in which the present invention is applied to the related-art semiconductor integrated circuit device described above with reference to FIG. 3 and FIG. 4 is described with reference to FIG. 8 and FIG. 9. As illustrated in FIG. 8 and FIG. 9, an input terminal for regulation 112 for inputting a voltage/current applied from the outside is added to the reference voltage circuit 100. A specific element in the reference voltage circuit is replaced by a semiconductor nonvolatile memory element. The semiconductor nonvolatile memory element can change a threshold voltage depending on the voltage/current input to the input terminal for regulation 112 from the outside.

A method of regulating an output voltage is now described with reference to FIG. 1.

Figure 1:
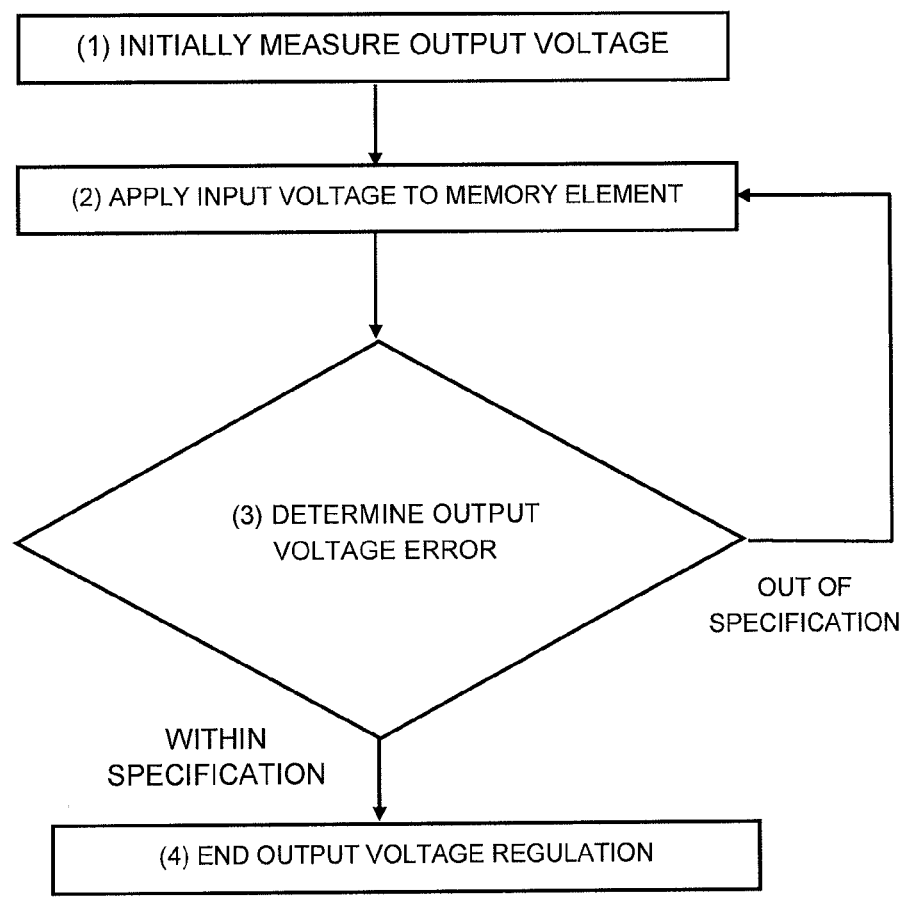
FIG. 1 is a process flow chart for illustrating a method of regulating an output voltage of a semiconductor integrated circuit device according to the present invention.

First, an output voltage of a product completed in a semiconductor processing factory is measured as it is (a process step of (1) in FIG. 1).

Then, a voltage/current is applied to the semiconductor nonvolatile memory element in the reference voltage circuit via the input terminal for regulation to change the threshold voltage of the semiconductor nonvolatile memory element (a process step of (2) in FIG. 1). In the semiconductor integrated circuit device as illustrated in FIG. 8 or FIG. 9, when the reference voltage value that is output from the reference voltage circuit changes, in accordance with Expression (1), the output voltage is also changed in proportion thereto, and thus, the amount of the voltage/current applied to the input terminal for regulation and an amount of the output voltage are directly proportional to each other.

After that, the output voltage is measured. If the output voltage is out of tolerance required for the product, the process returns to the process step of (2) in FIG. 1 to start again application of a voltage/current to the semiconductor nonvolatile memory element. In this case, a-method in which the reference voltage value of the reference voltage circuit is set in advance so that an initial output voltage value is out of specification and the voltage/current applied to the semiconductor nonvolatile memory element is gradually changed in one direction, i.e., in a + direction or in a − direction to fit the product into specification is an easy way of regulation, and thus, is preferred.

The process step of (2) and a process step of (3) in FIG. 1 are repeated, and, when the output voltage value is within specification, the series of processing ends (a process step of (4) in FIG. 1). The process step of (2) and the process step of (3) in FIG. 1 can be, in reality, performed not intermittently but electrically continuously, and thus, by writing a program software and exerting automatic control, it takes only a short time to fit an out-of-specification product into specification.

Figure 2:
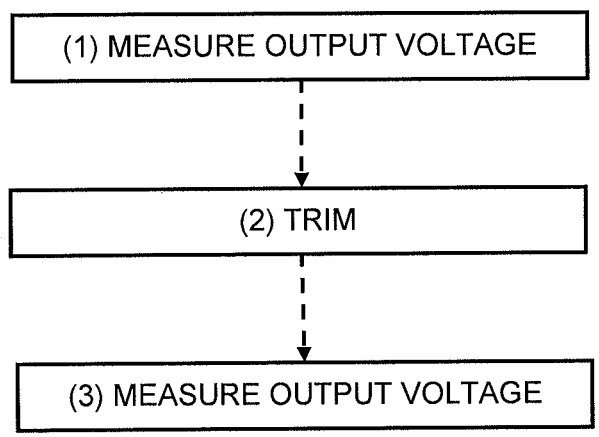
FIG. 2 is a process flow chart for illustrating a method of regulating an output voltage of a related-art semiconductor integrated circuit device.

By adopting such a method, the related-art three-step process from the process step of (1) to the process step of (3) in FIG. 2 that cannot be redone can be completed in single electrical processing, which can simplify the method of regulating the output voltage and can reduce to a large extent time necessary for completing the product. Further, the method regulates the output voltage through online trimming during which the output voltage is monitored, and thus, faulty products out of specification are inhibited, and improvement in yield can be expected.

Further, influence of high heat (temperature coefficient and recrystallization of the resistors) such as in a related-art online trimming through processing of resistors with a laser can be eliminated, and thus, it is not necessary to fear an error in and reregulation of the output voltage, and a stable output voltage can be maintained.

Further, this regulating method is electrical processing that is performed irrespective of a form of the product (wafer or package), and thus, even if the form of the product changes and the characteristics fluctuate accordingly, electrical reregulation through a terminal can be performed. For example, when an output voltage of a product in a wafer state is regulated, and then, after the product is packaged, the output voltage is changed under the influence of thermal hysteresis, resin stress, or the like and the product goes out of specification, the product in a package state can be reregulated to be fit into specification. Alternatively, the output voltage may be regulated only in a final form. By omitting measurement/processing in the wafer state, the frequency of the test can be lowered and the number of the process steps can be reduced.

Further, in addition to the lowered frequency of the test described above, the need for the laser trimming step is eliminated, and thus, the effect of inhibiting investment in equipment such as the measurement apparatus and the laser apparatus is also great.

Further, the voltage dividing circuit 103 including the resistance elements 102 illustrated in FIG. 8 or FIG. 9 is not required to be highly accurate. Even if the accuracy of the voltage dividing circuit 103 is low, the method according to the present invention enables the output voltage value to be fit into specification, and thus, preparing a plurality of uniform resistance elements and consideration of a pattern layout thereof as in the related art are not necessary, and the fuse elements are also not necessary. Accordingly, there is an advantage in that the chip size and a layout load are expected to be reduced.

Next, a reference voltage circuit for carrying out the present invention is described with reference to FIG. 7A and FIG. 7B. As illustrated in FIG. 7B, in the reference voltage circuit, the depression type NMOS transistor 402 and the enhancement type NMOS transistor 401 are connected in series between an input terminal for regulation 406 and the ground terminal 404. A constant current is output from the depression type NMOS transistor 402 serving as a current source. A voltage generated at the drain terminal of the enhancement type NMOS transistor 401 serving as a load element is output as a constant voltage to the reference voltage output terminal 405.

Figure 7A:
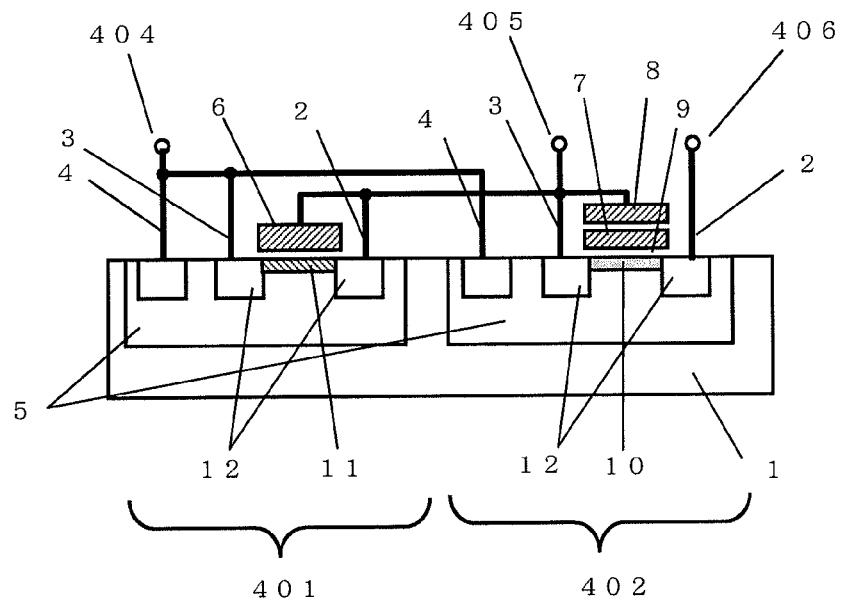
FIG. 7A is a schematic sectional view for illustrating a reference voltage circuit according to the present invention.
Figure 7B:
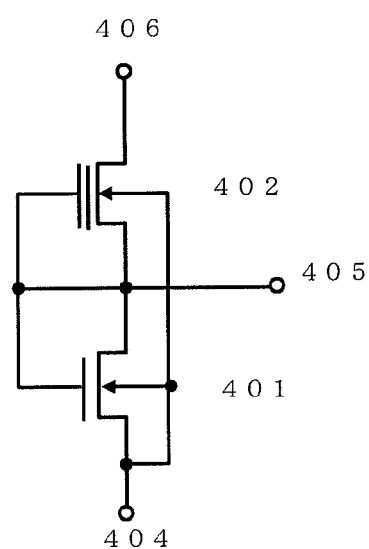
FIG. 7B is an illustration of an exemplary reference voltage circuit according to the present invention.

However, in this case, as illustrated in FIG. 7A, the depression type NMOS transistor 402 used in the present invention has a structure in which polycrystalline silicon gate electrodes are stacked, with an upper layer being a control gate electrode 8 for controlling the voltage, and a lower layer being a floating gate electrode 7 for injecting and accumulating charge.

In the exemplary circuit structure illustrated in FIG. 7B, when a voltage at the input terminal for regulation 406 rises, because a voltage between the reference voltage output terminal 405 and the ground terminal 404 is fixed at a certain value at all times, the voltage rise is borne between the input terminal for regulation 406 and the reference voltage output terminal 405. Accordingly, as a voltage applied to the input terminal for regulation 406 rises, a drain-source voltage of the depression type NMOS transistor 402 rises. Carriers with charges, in this case, holes are injected into, via a gate insulating film, the floating gate electrode 7 at a lower potential by a method to be described below, thereby being capable of charging the floating gate electrode to a positive side. This is equivalent to a lowered threshold voltage of the depression type NMOS transistor, when seen from a control gate electrode side. Under the influence of this, the amount of current of the depression type NMOS transistor increases, and the potential of the reference voltage output terminal 405 increases accordingly.

When the reference voltage value of the reference voltage circuit increases, in accordance with Expression (1), the output voltage of the step-down series regulator illustrated in FIG. 8 rises. Specifically, by controlling the voltage of the reference voltage circuit input terminal, the output voltage of the step-down series regulator can be arbitrarily changed. Note that, in this case, the input terminal for regulation 112 corresponds to the input terminal for regulation 406 illustrated in FIG. 7A and FIG. 7B.

In this case, the threshold voltage of the semiconductor nonvolatile memory element is changed to a negative direction by voltage regulation via the input terminal for regulation, and thus, in accordance with Expression (2), the value of Vtd that is originally negative is changed further to the negative side, |Vtd| as an absolute value thereof increases, and the reference voltage that is output from the reference voltage circuit is changed to a higher direction. Then, the output voltage of the step-down series regulator is changed in a higher direction accordingly. Thus, when the output voltage of the step-down series regulator according to the present invention is designed so as to have a lower value than that of required specifications before regulation by the input terminal for regulation, through regulation of the output voltage by the input terminal for regulation, a wide range of required specifications on the output voltage can be accommodated.

Further, according to this method, the output voltage can be fit into a predetermined target voltage value not via a laser trimming step but only through electrical control with high accuracy.

Figure 19A:
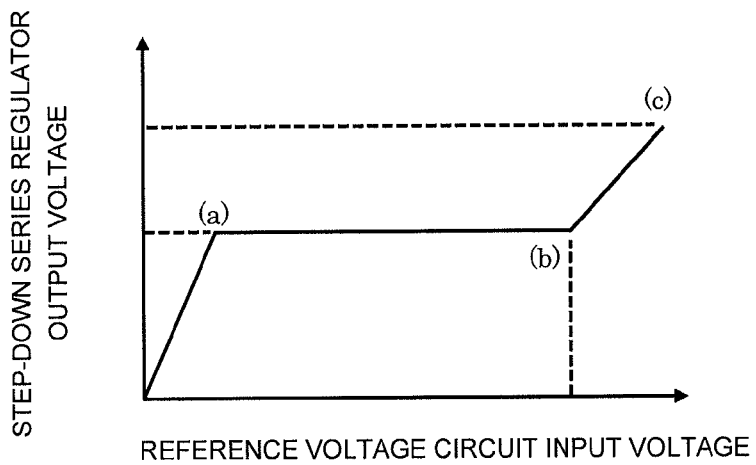
FIG. 19A and FIG. 19B are graphs for showing electrical characteristics when the present invention is applied to a step-down series regulator.
Figure 19B:
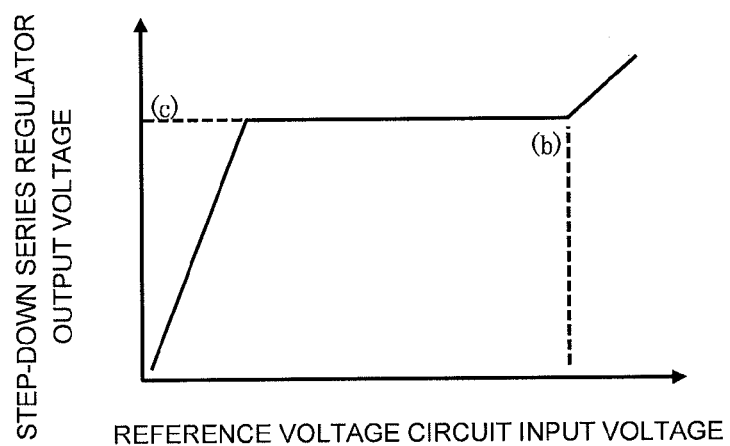

A specific example is described with reference to FIG. 19A and FIG. 19B. In graphs of FIG. 19A and FIG. 19B, the horizontal axis denotes a voltage that is input to the input terminal for regulation 406 of the reference voltage circuit as illustrated in FIG. 7A and FIG. 7B and the vertical axis denotes a voltage that is output from the output terminal 107 of the step-down series regulator as illustrated in FIG. 8 including the reference voltage circuit. FIG. 19A shows output voltage characteristics before the regulation by the input terminal for regulation, and FIG. 19B shows output voltage characteristics after the regulation.

First, before the regulation of the input, as shown in FIG. 19A, until the input voltage reaches a point (a) (range in which the reference voltage circuit normally operates), the output voltage increases as the input voltage to the reference voltage circuit increases. When the output voltage reaches the voltage calculated by Expression (1), the output voltage remains constant until a point (b) is reached. Up to this point, the electrical characteristics are completely the same as those of the related-art step-down series regulator.

After that, when the point (b) is reached at which the input voltage becomes high enough for the carriers to be injected into the floating gate electrode of the semiconductor nonvolatile memory element, injection of the carriers into the semiconductor nonvolatile memory element begins. At the same time, the threshold voltage of the semiconductor nonvolatile memory element changes. Accordingly, in accordance with the amount of the injected carriers, the output voltage begins to increase again. When application of higher input voltage is stopped when a point (c) is reached at which the output voltage has a desired value, the carrier injection into the semiconductor nonvolatile memory element is stopped, and the carriers are stored in the floating gate electrode. The electrical characteristics after the above-mentioned operations end are as shown in FIG. 19B.

In other words, the threshold voltage of the semiconductor nonvolatile memory element changes in accordance with the amount of the carriers injected into the semiconductor nonvolatile memory element, and thus, |Vtd| increases in accordance with Expression (2), and the constant output voltage in accordance with the reference voltage circuit constant voltage and Expression (1) is also changed to the high output voltage at the point (c). When a voltage equal to or higher than that at the point (b) is applied to the input terminal for regulation, carrier injection into the semiconductor nonvolatile memory element begins again and the output voltage begins to increase again.

Attention needs to be given to, first, a point that, in order to enable the output voltage regulation as shown in FIG. 19A, the semiconductor nonvolatile memory element needs to be designed so as to have a sufficiently high drain breakdown voltage so that the element may not be broken down even when the input voltage reaches the value of the point (c).

A second point to which attention needs to be given is that, after the output voltage is regulated to have the desired value, a maximum value of the input voltage when the product is actually used needs to be sufficiently lower than that at the point (b) so that the output voltage may not be changed due to the carrier reinjection while the product is used. In other words, it is necessary that a semiconductor integrated circuit device to which the present invention is applied has such a product specification that an operating voltage thereof is equal to or lower than the voltage at the point (b) without fail. Accordingly, semiconductor nonvolatile memory elements having characteristics suitable for respective product specifications of semiconductor integrated circuit devices are prepared in advance.

Figure 4:
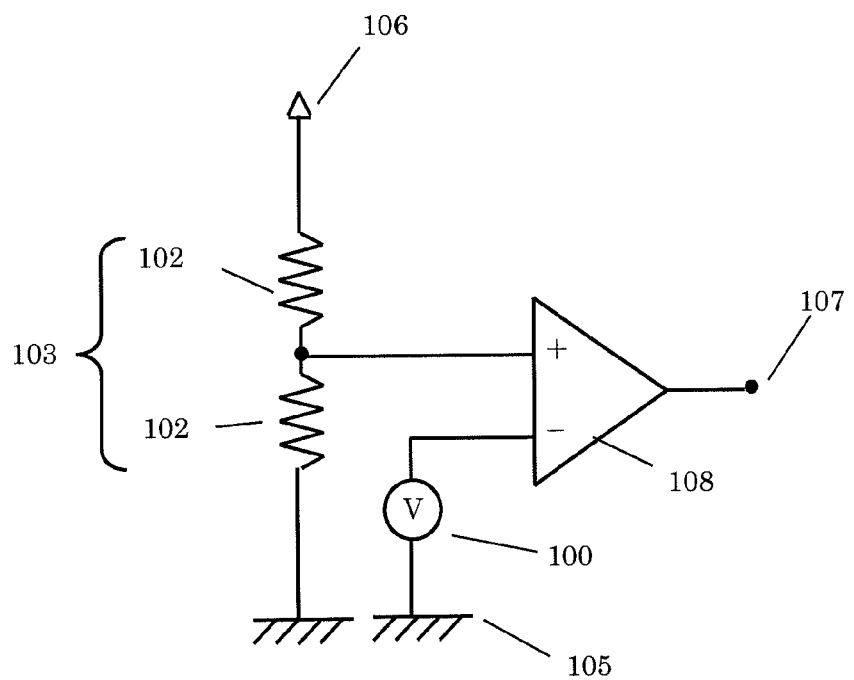
FIG. 4 is a schematic circuit diagram of a voltage detector of the related-art semiconductor integrated circuit device.
Figure 5:
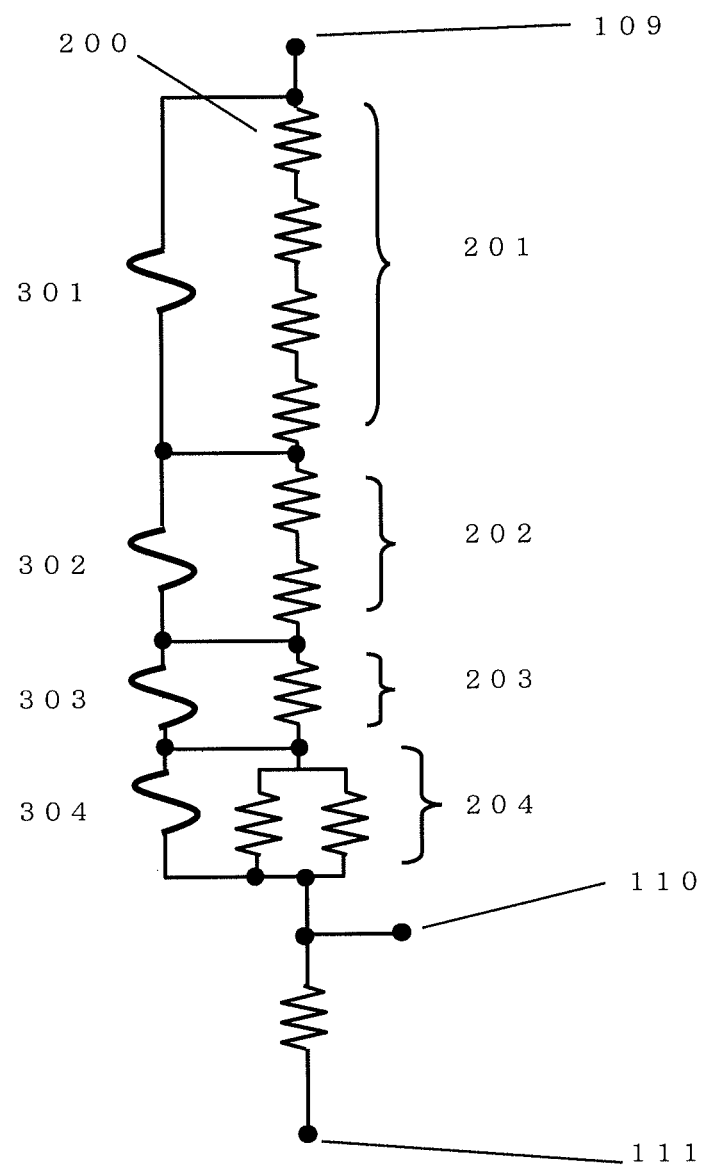
FIG. 5 is an illustration of an exemplary voltage dividing circuit in which related-art resistance elements are combined.
Figure 6A:
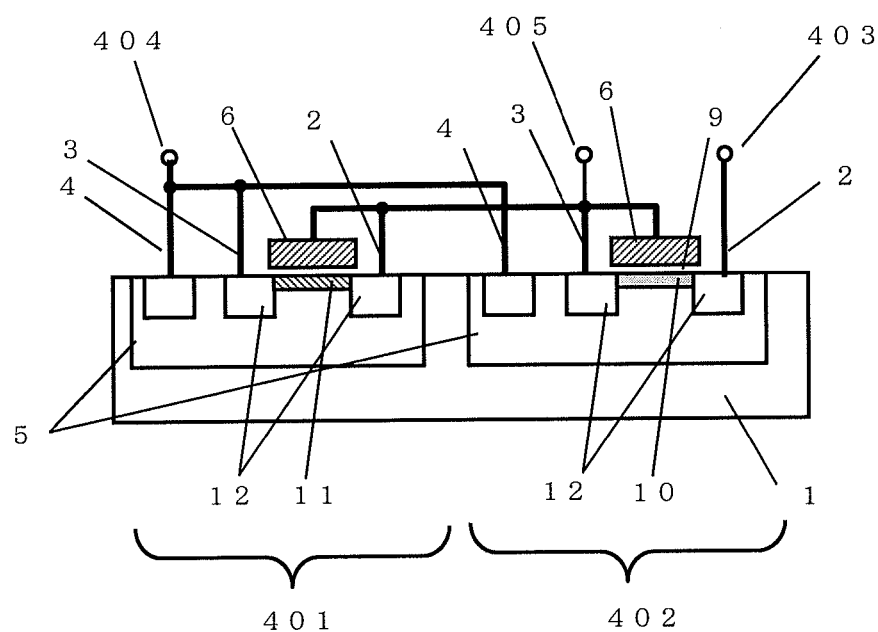
FIG. 6A is a schematic sectional view for illustrating a related-art reference voltage circuit.
Figure 6B:
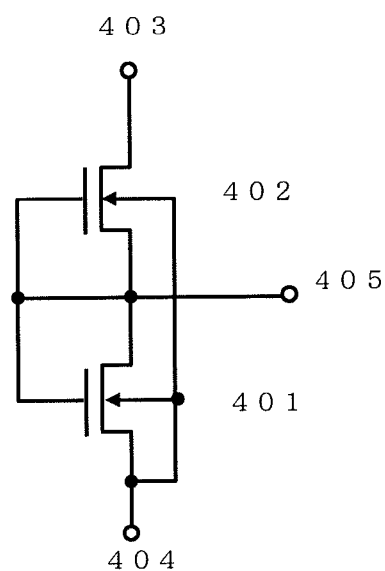
FIG. 6B is an illustration of an exemplary related-art reference voltage circuit.

Similarly, by realizing the reference voltage circuit in a voltage detection circuit illustrated in FIG. 4 using a similar circuit, the output voltages of the respective semiconductor integrated circuit devices can be similarly controlled and set through voltage control of the input terminal for regulation connected to the reference voltage circuit.

Further, with regard to the reference voltage circuit, it goes without saying that the present invention can be applied to any structure of a circuit insofar as the circuit basically operates with a combination of an element serving as a current source and an element serving as a load as described above.

Further, the semiconductor nonvolatile memory element described herein is meant to refer to any kind of element whose threshold voltage can be shifted through carrier injection such as charge injection into the floating gate electrode as hot carrier injection, carrier injection using an FN tunnel current via a gate insulating film, or trapping of carriers in a level existing in an insulating film.

Next, the semiconductor nonvolatile memory element to which the present invention is applied is described in detail.

Figure 10:
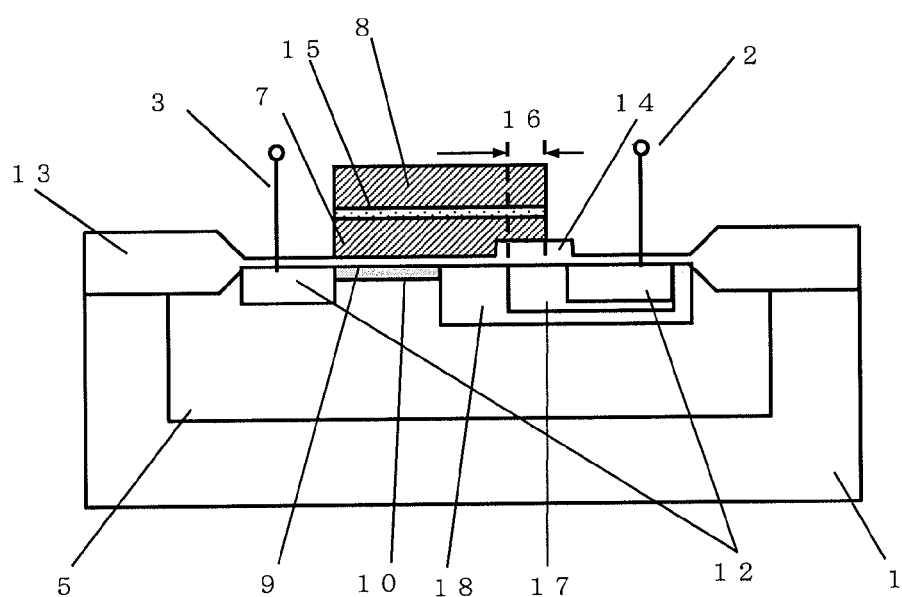
FIG. 10 is a schematic sectional view for illustrating a semiconductor nonvolatile memory element according to a first embodiment of the present invention.

FIG. 10 is a sectional view for illustrating a semiconductor nonvolatile memory element according to the first embodiment of the present invention. The element illustrated in FIG. 10 is formed in a P-type well region 5 containing boron as impurities at a concentration of from about $7 \times 10^{15}/cm^3$ to about $7 \times 10^{16}/cm^3$ that is formed on a semiconductor substrate 1. A depression type NMOS transistor including N-type source/drain regions 12, an N-type channel impurity region 10, gate insulating films 9, 14, and 15, and gate electrodes 7 and 8 is formed in a region surrounded by a LOCOS oxide film 13 used for element isolation and having a thickness of several thousands of angstromes to 2 μm.

Features are that the gate electrode has a structure in which the floating gate electrode 7 and a control gate electrode 8 that are formed of polycrystalline silicon are stacked, that the control gate electrode is connected to a source terminal 3 of the depression type NMOS transistor via metal wiring or the like (not shown), and that the floating gate electrode 7 is surrounded by the first gate insulating film 9, the second gate insulating film 14, and the third gate insulating film 15 and is in a state of having no electrical connection.

Carriers such as electrons or holes are injected into the floating gate electrode 7 from a drain terminal 2 via the second gate insulating film 14. When positive or negative carriers are injected into the floating gate electrode 7, similarly to a case of fixed charge existing between a gate electrode and a channel region in an ordinary MOSFET, the threshold voltage of the depression type NMOS transistor changes in accordance with the injected amount.

Through holding the injected carriers under such structural conditions that the carriers do not escape with heat or electrical stress in normal operation, the threshold voltage of the depression type NMOS transistor can be regulated to and maintained at a desired value.

The threshold voltage when carriers are not injected into the floating gate electrode 7 is set to be a certain negative value in accordance with the amount of impurities in the N-type channel impurity region 10 so that the depression type NMOS transistor is in a normally on state in which current flows even when agate-source voltage is 0 V, whenever a voltage is applied between the drain and the source.

The N-type source/drain regions 12 function as source/drain terminals by lowering resistance thereof under a state in which N-type impurities such as As or P of $1 \times 10^{20}/cm^3$ or more are injected thereinto. The drain terminal side further includes an N-type heavily doped impurity region 17 containing N-type impurities such as As or P of $5 \times 10^{18}/cm^3$ or more and a first N-type lightly doped impurity region 18 containing N-type impurities such as As or P of $1 \times 10^{17}/cm^3$ or more and $1 \times 10^1/cm^3$ or less between the drain terminal side and the channel impurity region 10.

The first N-type lightly doped impurity region 18 plays a role in relaxing an electric field through extension of a depletion layer on the drain side when a drain voltage is applied and in realizing thereby a higher breakdown voltage. The N-type heavily doped impurity region 17 is used as a lower electrode when carriers are injected into the floating gate electrode 7.

A first reason why the impurity concentration of the N-type heavily doped impurity region 17 is $5 \times 10^{18}/cm^3$ or more is to prevent injection efficiency from being lowered due to a depleted surface of the N-type heavily doped impurity region 17 to which a positive voltage is applied when holes are injected as carriers into the floating gate electrode 7 and due to a relaxed electric field between the floating gate electrode 7 and the N-type heavily doped impurity region 17.

A second reason is to prevent a depletion layer between the drain and a well that extends from the N-type lightly doped impurity region 18 to the drain side when, similarly, a high voltage is applied to the N-type heavily doped impurity region 17 for the purpose of injecting holes as carriers into the floating gate electrode 7 and to thereby prevent carrier injection efficiency from being lowered.

Incidentally, the N-type heavily doped impurity region 17 and the floating gate electrode 7 have an overlapping portion 16. The second gate insulating film 14 that exists in the overlapping portion 16 has a thickness that is different from that of the gate insulating film 9 formed on the N-type channel impurity region 10. In general, a gate insulating film is set to have a predetermined thickness in accordance with an operating voltage of a semiconductor integrated circuit device including a MOSFET that includes the gate insulating film from the viewpoint of reliability for a long time. However, the second gate insulating film 14 of the semiconductor nonvolatile memory element according to this embodiment adopts a thickness that is determined so as to be suitable for carrier injection into the floating gate electrode 7 and that is larger than the above-mentioned thickness determined by the reliability for a long time in accordance with the operating voltage for the purpose of preventing charge from escaping within an operating voltage range.

Accordingly, according to this embodiment, the second gate insulating film 14 has a thickness that is larger than that of the gate insulating film 9 formed on the N-type channel impurity region 10.

Another feature of the semiconductor nonvolatile memory element according to the present invention is that regulation specialized for characteristics of a semiconductor nonvolatile memory element and semiconductor integrated circuit device including the same is performed in an analog way, and the regulation is performed through replacement of an element that is a part of a related-art semiconductor nonvolatile memory element. Accordingly, formation of a memory array for the purpose of storing information is not assumed, and a structure such as a select gate for identifying an address that is necessary when a memory array is formed is not required.

Next, electrical operation according to the present invention is described in detail.

For example, a potential of the floating gate electrode 7 changes to a negative potential when electrons having negative charge are injected thereinto. In that case, in response to the negative charge, positive charge is induced in the channel region, or, electrons in the N-type channel impurity region 10 reduce, and the threshold voltage of the N-channel type MOSFET changes to the positive side.

On the other hand, when holes having positive charge are injected into the floating gate electrode 7, the potential of the floating gate electrode 7 is shifted to the positive side and an electron concentration in the N-type channel impurity region 10 increases. As a result, the threshold voltage of the N-channel type MOSFET changes to the negative side.

According to the present invention, due to the existence of the N-type channel impurity region 10, the threshold voltage of the depression type NMOS transistor has a negative value under a state in which no carrier is injected, and thus, through application of a positive potential to the floating gate electrode 7 and injection of holes as carriers from the N-type heavily doped impurity region 17 side, the negative threshold voltage is changed further to the negative side, and the threshold voltage is controlled with high accuracy.

An ordinary semiconductor nonvolatile memory element is under binary control with threshold voltages, for example, one is set higher than 0 V and the other is set lower than 0 V. A plurality of such elements is combined to be used for holding necessary information in a digital way. The present invention is different from the related-art method in that only one element is used, information is determined in an analog way by the amount of carriers in the floating gate electrode, and the information is kept held.

According to the present invention, making full use of such a function of changing the threshold voltage and nonvolatility, carriers are injected into the semiconductor nonvolatile memory element in advance before shipment to a customer to regulate the threshold voltage of the semiconductor nonvolatile memory element, thereby regulating circuit characteristics of a semiconductor integrated circuit device including the semiconductor nonvolatile memory element to have a desired value. After that, no carriers are put in/out during usage by the customer, and reliability at a high level for repeated erasing and writing is not necessary for the second gate insulating film 14.

According to the present invention, carriers are injected into the floating gate electrode 7 as follows. First, the amount of impurities in the N-type channel impurity region 10 is set such that, under a state in which no carriers are injected, the threshold voltage is set to be of a negative value that is higher than (on the positive side with respect to) a final target value.

Then, in a step of testing the semiconductor integrated circuit device after a semiconductor manufacturing process, the source potential and the control gate electrode potential are set to be the same low potential while the drain potential is changed to a higher potential on the positive side. In this state, the floating gate potential is of a value between the drain potential and the source potential/control gate electrode potential, in accordance with a capacitance ratio that is determined by thicknesses of the first gate insulating film 9, the second gate insulating film 14, and the third gate insulating film 15 and by sizes of the control gate electrode 8 and the floating gate electrode 7. Through regulation of the sizes and the thicknesses described above, the value is set to be a low value close to the source potential/control gate electrode potential so that most of the drain-source voltage is applied to the second gate insulating film 14.

In this depression type NMOS transistor, even if the potential of the control gate electrode 8 is 0 V, the threshold voltage is of a negative value, and thus, as the drain potential rises, a drain current flows. After the current characteristics goes out of an non-saturated region into a saturated region, the current is stabilized at a constant saturation current value that does not depend on the drain potential. A potential at an end of the depletion layer generated on the drain side in the N-type channel impurity region 10 is fixed to a low constant value (pinch-off voltage) determined by the gate-source voltage and the threshold voltage, and thus, a voltage that is a difference between the drain-source voltage and the pinch-off voltage is applied to the depletion layer generated in the first N-type lightly doped impurity region 18. The depletion layer has an impurity concentration that is lower than the sufficiently high impurity concentration in the N-type heavily doped impurity region 17, and thus, with regard to the potential of the N-type heavily doped impurity region 17, the drain potential applied to the drain terminal 2 is applied as it is to the N-type heavily doped impurity region 17, and it is easy to control a potential difference between the N-type heavily doped impurity region 17 and the control gate electrode 8.

At this time, by arbitrarily setting the impurity concentration and a length in a plane direction of the first N-type lightly doped impurity region 18, the amount of extension of the depletion layer generated in the N-type lightly doped impurity region 18 can be controlled, and an upper limit of the applied drain voltage due to avalanche breakdown can be raised. This enables setting a potential applied to the N-type heavily doped impurity region 17 to have a large value, and thus, a potential for injecting carriers can be secured even if the second gate insulating film 14 is set to have a large thickness.

For example, by setting the first N-type lightly doped impurity region 18 to have an impurity concentration of from $1 \times 10^{17}/cm^3$ to $1 \times 10^{18}/cm^3$ and setting a length from the channel region 10 to the N-type heavily doped impurity region 17 in the plane direction to be 1.5 μm or more, the drain breakdown voltage can be 20 V or higher, and a carrier injection voltage of 20 V or higher can be secured.

In this case, when the second gate insulating film 14 has a thickness of, for example, 400 Å, tunneling can be induced by applying a voltage of about 20 V or higher. Thus, in the drain structure described above, by setting the drain voltage to be 20 V or higher, injection of holes having positive charge based on the tunneling is realized in the overlapping portion 16 of the N-type heavily doped impurity region 17 and the floating gate electrode 7. On the other hand, a voltage applied to the N-type channel impurity region 10 is equal to or lower than the pinch-off voltage described above, and thus, insofar as an insulating film thickness in accordance with the pinch-off voltage is secured, tunneling is not induced in the first gate insulating film 9 between the N-type channel impurity region 10 and the floating gate electrode 7.

As described above, it is preferred that the drain voltage applied in the testing step be sufficiently higher than the operating voltage of the semiconductor integrated circuit device including this semiconductor nonvolatile memory element. This can prevent carriers from being injected into the floating gate electrode 7 while a power supply voltage fluctuates within the range of the operating voltage of the semiconductor integrated circuit device, to thereby inhibit fluctuations in threshold voltage of the semiconductor nonvolatile memory element and change in circuit characteristics of the semiconductor integrated circuit device that is caused due to the fluctuations. For example, in the example described above, it is desired that the operating voltage of the semiconductor integrated circuit device be 10 V or lower. In this way, for the purpose of securing a sufficient potential difference between the operating voltage and the carrier injection voltage (in the example described above, 20 V−10 V=10 V), it is necessary to set the thickness of the second gate insulating film 14 and the conditions on the first N-type lightly doped impurity region 18.

The amount of carriers to be stored in the floating gate electrode 7 can be determined through gradual increase in drain voltage as illustrated in FIG. 19A and FIG. 19B. Alternately, the amount of charge of holes to be stored in the floating gate electrode 7 can also be controlled by a product of the value of the drain voltage and a time period of application thereof. As described above, the threshold voltage of the depression type NMOS transistor is shifted further to the negative side in accordance with the amount of stored charge of the holes, and thus, it is possible to apply a high constant drain voltage until a desired threshold voltage is reached, to thereby regulate, with high accuracy, the threshold voltage of the N-channel type MOSFET with the time period of application thereof while the output voltage is being monitored.

Figure 11:
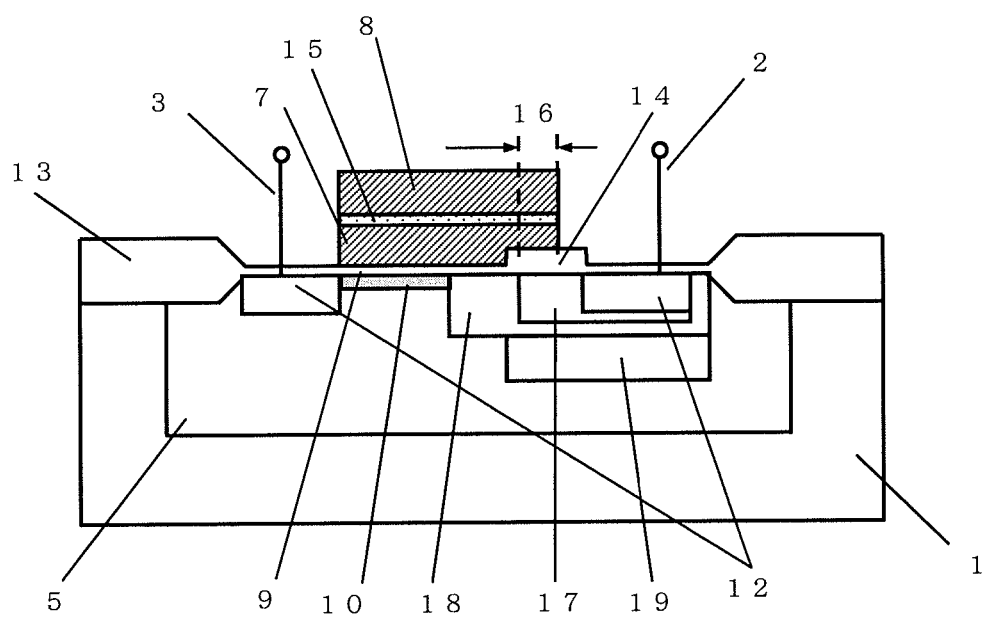
FIG. 11 is a schematic sectional view for illustrating a semiconductor nonvolatile memory element according to a second embodiment of the present invention.

FIG. 11 is a sectional view for illustrating a semiconductor nonvolatile memory element according to a second embodiment of the present invention. In the semiconductor nonvolatile memory element illustrated in FIG. 11, in addition to the structure illustrated in FIG. 10, a second N-type lightly doped impurity region 19 containing As or P having an impurity concentration of from about $2 \times 10^{16}/cm^3$ to about $2 \times 10^{17}/cm^3$ is added under the first N-type lightly doped impurity region 18. In the case illustrated in FIG. 10, depending on the conditions on the first N-type lightly doped impurity region 18, it is easy to set the drain breakdown voltage to be as high as about 30 V.

However, with regard to the depletion layer in the first N-type lightly doped impurity region 18 and in the P-type well region 5 thereunder, extension of the depletion layer to the first N-type lightly doped impurity region 18 side is limited, and it is difficult to set the breakdown voltage to be higher than 30 V. Accordingly, by adding the second N-type lightly doped impurity region 19 as illustrated in FIG. 11 to secure extension of the depletion layer corresponding to a diffusion depth thereof, a drain breakdown voltage that is higher than 30 V can be attained. This is effective in accommodating a semiconductor integrated circuit device having a higher operating voltage and in securing a larger margin between the operating voltage and a tunneling voltage.

Figure 12:
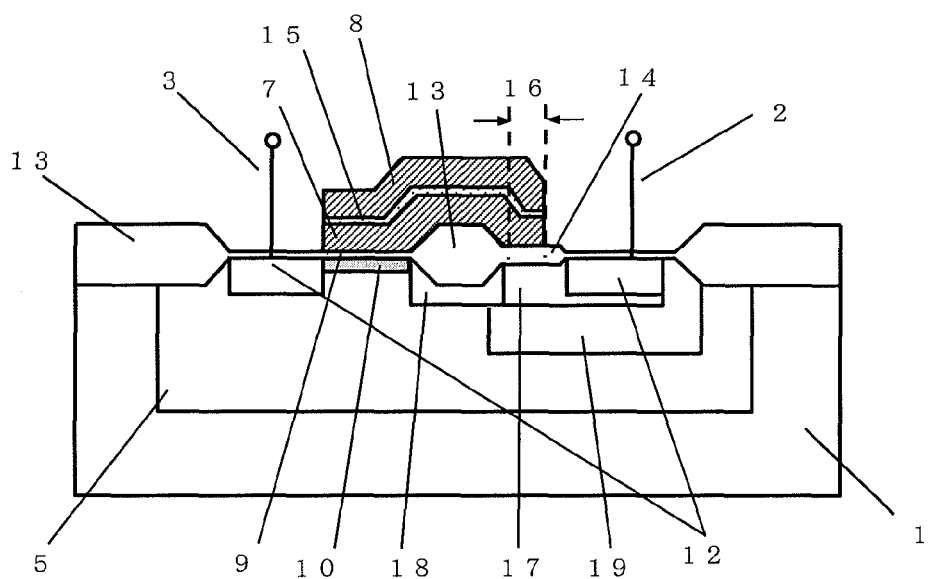
FIG. 12 is a schematic sectional view for illustrating a semiconductor nonvolatile memory element according to a third embodiment of the present invention.

FIG. 12 is a sectional view for illustrating a semiconductor nonvolatile memory element according to a third embodiment of the present invention. In the semiconductor nonvolatile memory element illustrated in FIG. 12, an oxide film 13 having a thickness that is larger than those of the first gate insulating film 9 and the second gate insulating film 14 is formed between the floating gate electrode 7 and the first N-type lightly doped impurity region 18. Such a structure can relax a high electric field between the floating gate electrode 7 having a low potential and the first N-type lightly doped impurity region 18 that is induced when the drain voltage is increased, and the drain breakdown voltage can be set to be as high as about 60 V.

The thick oxide film 13 can have an arbitrary thickness depending on the extent of the necessary relaxation of the electric field. When the drain breakdown voltage is higher than 30 V, it is preferred that the thickness be 1,000 Å or more. Further, by forming the thick oxide film 13 simultaneously with a LOCOS oxide film in the element isolation region, increase in the number of process steps can be prevented.

Figure 13:
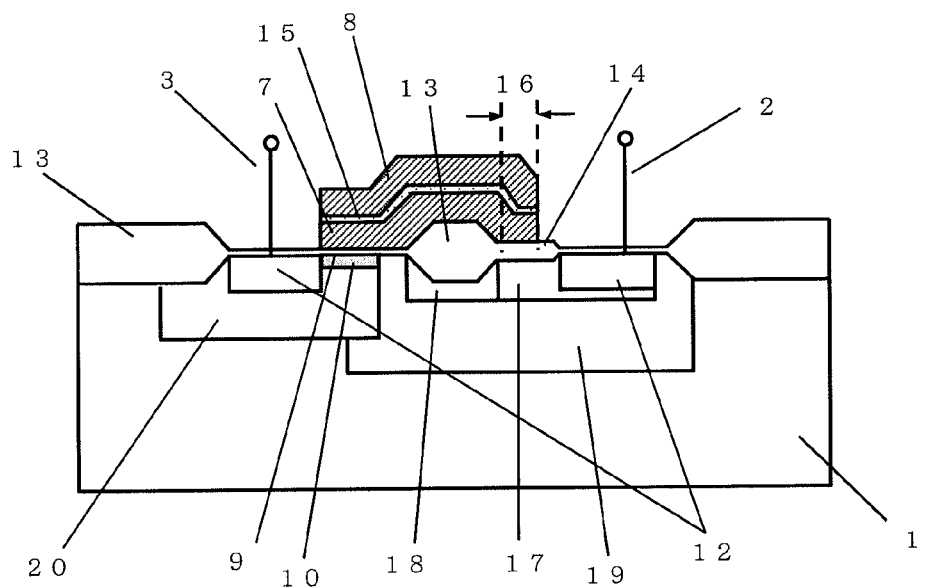
FIG. 13 is a schematic sectional view for illustrating a semiconductor nonvolatile memory element according to a fourth embodiment of the present invention.

FIG. 13 is a sectional view for illustrating a semiconductor nonvolatile memory element according to a fourth embodiment of the present invention. In the semiconductor nonvolatile memory element illustrated in FIG. 13, the second N-type lightly doped impurity region 19 illustrated in FIG. 12 is extended to a direction to the source terminal 3 side to an extent so as to overlap the N-type channel impurity region 10. In addition, a P-type lightly doped impurity region 20 having an impurity concentration that is higher than that of the second N-type lightly doped impurity region 19 is formed so as to surround the source terminal 3.

The P-type lightly doped impurity region 20 is formed in a region that is close to the first gate insulating film 9 and that does not exceed the thick oxide film 13, and contains B or $BF_2$ having an impurity concentration of from about $2 \times 10^{16}/cm^3$ to about $2 \times 10^{17}/cm^3$, which is higher than that of the second N-type lightly doped impurity region 19. The structure in which the P-type lightly doped impurity region 20 has an impurity concentration that is higher than that of the second N-type lightly doped impurity region 19 enables further extension to the drain side of the depletion layer on the channel side and on the drain side that is generated when the drain voltage is increased, which is effective when a drain breakdown voltage of 60 V or higher is required to be obtained.

In the first to fourth embodiments described above, as illustrated in FIG. 10 to FIG. 13, the floating gate electrode 7 and the control gate electrode 8 are formed by stacked polycrystalline silicon layers. Such a method using two polycrystalline silicon layers can inhibit increase in area of the gate electrode to facilitate lower costs, but the number of process steps increases and the processing is complicated. This leads to, for example, difficult selection of conditions on dry etching when the floating gate electrode 7, the control gate electrode 8, and the third gate insulating film 15 therebetween are collectively processed and deteriorated flatness due to etching resistance of a resist to be a mask, a stringer of polycrystalline silicon formed at a portion having a level difference, or a high-aspect-ratio gate electrode structure.

FIG. 14A to FIG. 17C are illustrations of methods of realizing a semiconductor nonvolatile memory element using only one polycrystalline silicon layer for the purpose of overcoming the complication, and correspond to the structures illustrated in FIG. 10 to FIG. 13, respectively.

Figure 14A:
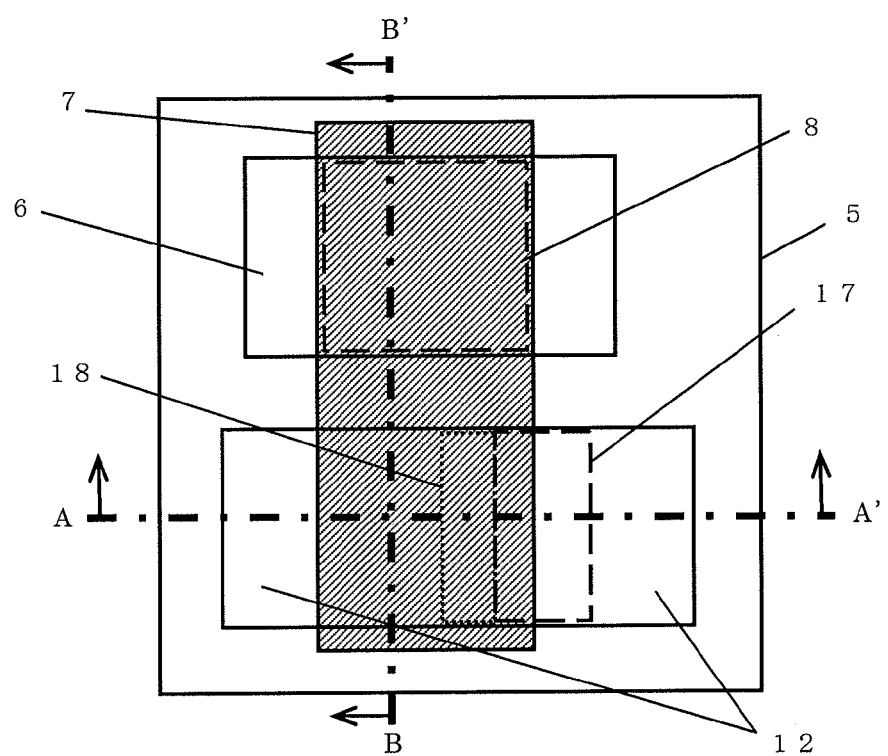
FIG. 14A, FIG. 14B, and FIG. 14C are schematic sectional views for illustrating a semiconductor nonvolatile memory element according to a fifth embodiment of the present invention.
Figure 14B:
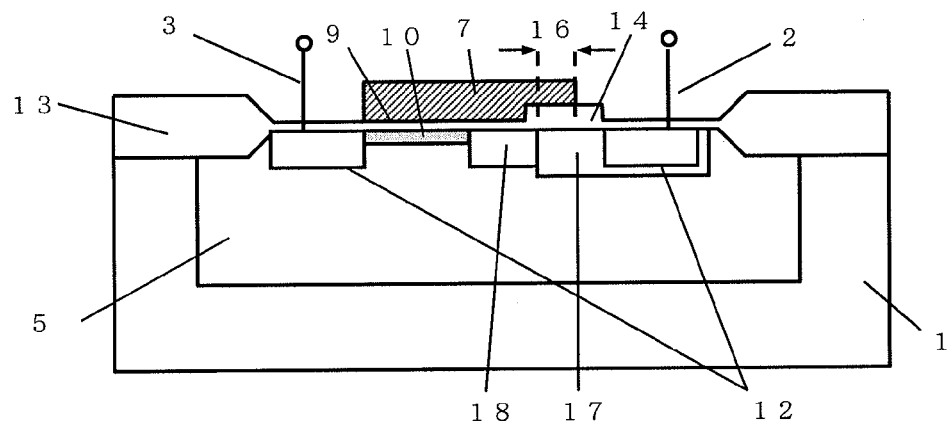
Figure 14C:
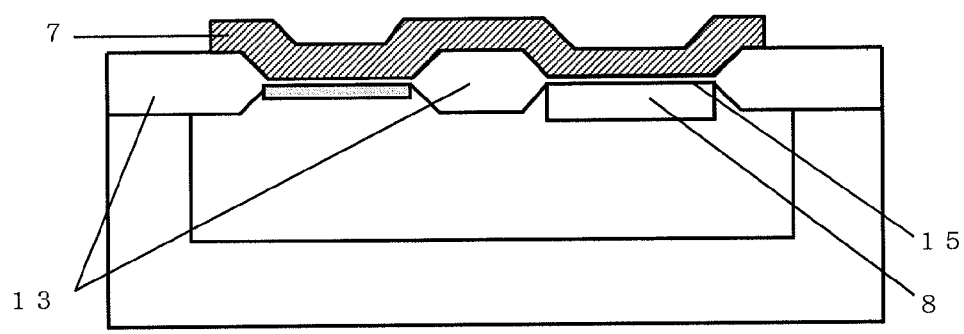

First, FIG. 14A, FIG. 14B, and FIG. 14C are illustrations of a fifth embodiment of the present invention in which the two-layer gate electrode structure of polycrystalline silicon illustrated in FIG. 10 is changed to a single-layer structure.

FIG. 14A is a plan view, and FIG. 14B and FIG. 14C are sectional views taken along the lines A-A' and B-B', respectively, of FIG. 14A. The polycrystalline silicon structure including two stacked layers illustrated in FIG. 10 is changed to a single-layer structure including only the floating gate electrode 7. As illustrated in FIG. 14B, the control gate electrode 8 and the third gate insulating film 15 are not formed on the floating gate electrode 7. Instead, as illustrated in FIG. 14A, the floating gate electrode 7 extends beyond the channel region so as to overlap the control gate electrode 8 that uses an impurity diffusion region in the semiconductor substrate 1. The control gate electrode 8 that uses the impurity diffusion region in the semiconductor substrate 1 includes a potential output portion 6. The control gate electrode 8 may use the impurities and a structure and a process step of, for example, the N-type heavily doped impurity region 17 in common, and the N-type high-concentration impurities in the source/drain regions 12 may also be used in the potential output portion 6.

Further, the third gate insulating film 15 between the floating gate electrode 7 and the control gate electrode 8 as used in the structure illustrated in FIG. 10 is formed of an oxide film on a surface of the semiconductor substrate 1 that is formed between the floating gate electrode 7 and the control gate electrode 8 serving as the impurity diffusion region in the semiconductor substrate 1. In this case, an oxide film formed simultaneously with the first gate insulating film 9 formed outside the channel region 10 is used.

The structure illustrated in FIG. 14A, FIG. 14B, and FIG. 14C requires two occupation areas for the control gate electrode 8 and the floating gate electrode 7 in the semiconductor integrated circuit device, and thus, the occupation area in the chip increases and cost also increases accordingly. However, the present invention is not applied to a memory array in which a large number of semiconductor nonvolatile memory elements are arrayed in a semiconductor integrated circuit device. Thus, the increase in occupied area is not to a large extent, and the increase in costs is almost no problem in the semiconductor integrated circuit device. On the other hand, as described above, the present invention has a strong point that, through elimination of the complication and the difficulty in manufacturing process, the effects of stabilized quality and a reduced number of process steps can be enjoyed.

Further, in the structure illustrated in FIG. 14A, FIG. 14B, and FIG. 14C, when a circuit is adopted in which the gate potential and the source potential, and the potential of the P-type well region that are used are a common low potential realized through connection using metal wiring or the like, the impurities in the control gate electrode 8 illustrated in FIG. 14C may be P-type high-concentration impurities, and further, the control gate electrode 8 may be the P-type well region 5 as it is.

The reason is that the semiconductor nonvolatile memory element according to the present invention is of a normally on type in which, due to the existence of the N-type channel impurity region 10, a current flows in accordance with the drain voltage even when the gate-source voltage is 0 V. Accordingly, when the P-type well region 5 is connected to the source terminal 3 using metal wiring or the like (not shown) located somewhere, the potential relationship is the same even if the impurities diffused in the control gate electrode 8 are of the P type.

Figure 15A:
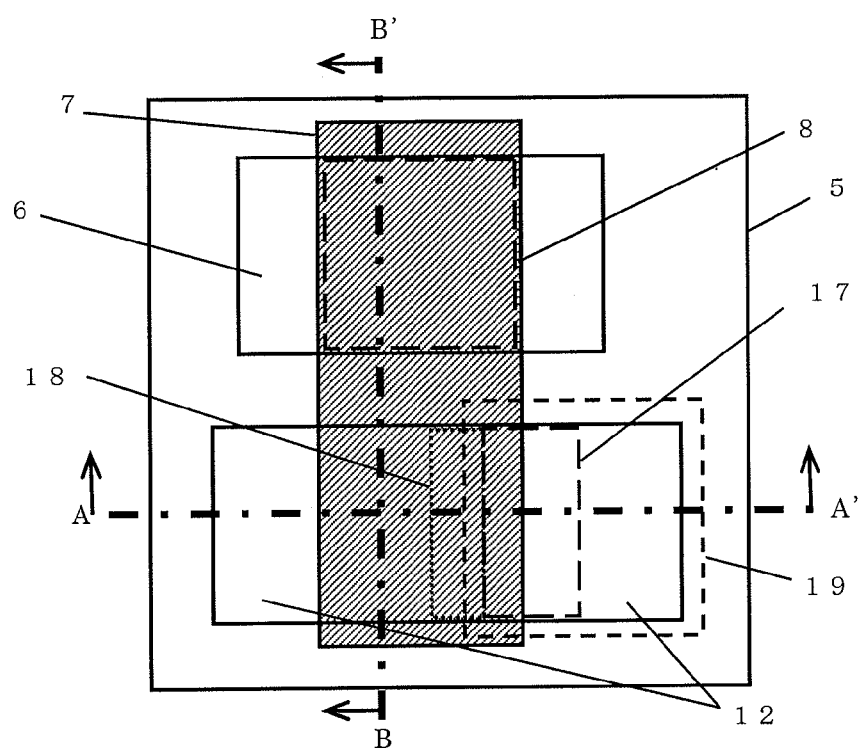
FIG. 15A, FIG. 15B, and FIG. 15C are schematic sectional views for illustrating a semiconductor nonvolatile memory element according to a sixth embodiment of the present invention.
Figure 15B:
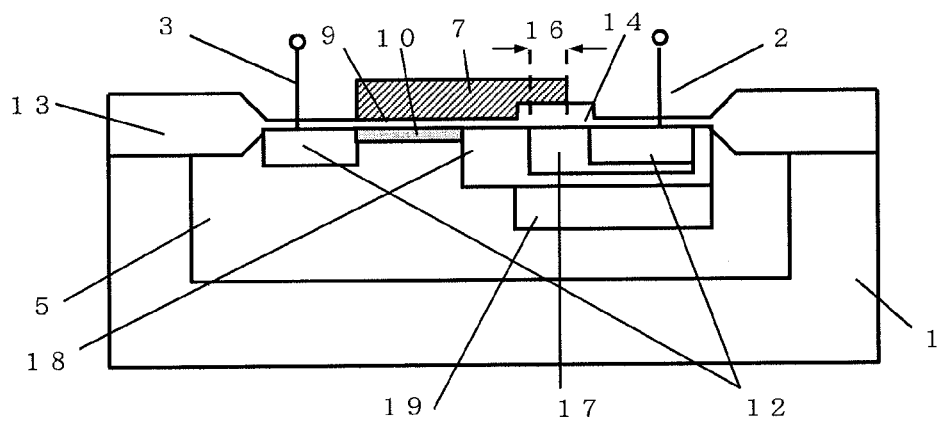
Figure 15C:
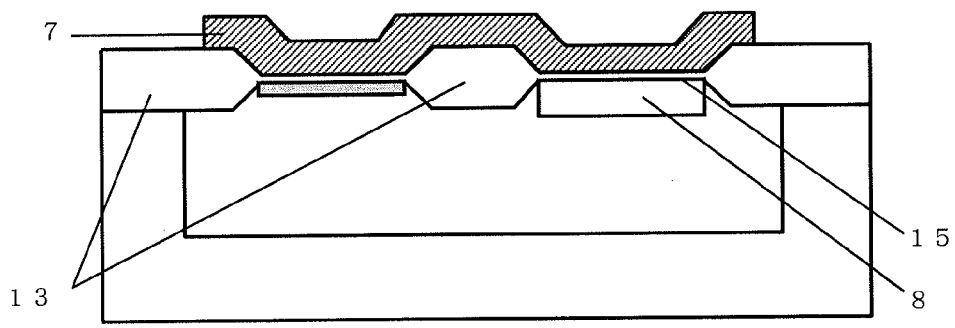

FIG. 15A, FIG. 15B, and FIG. 15C are illustrations of a sixth embodiment of the present invention in which the two-layer gate electrode structure of polycrystalline silicon illustrated in FIG. 11 is changed to a single-layer structure, which has an effect that is similar to that of the fifth embodiment described with reference to FIG. 14A, FIG. 14B, and FIG. 14C. FIG. 15A is a plan view, and FIG. 15B and FIG. 15C are sectional views taken along the lines A-A' and B-B', respectively of FIG. 15A.

Figure 16A:
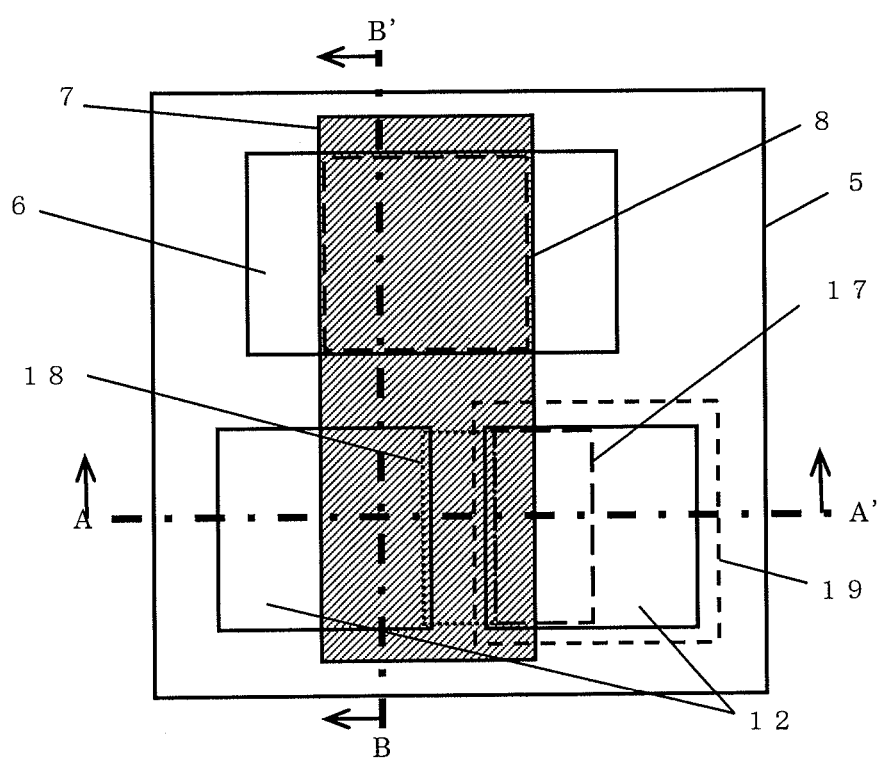
FIG. 16A, FIG. 16B, and FIG. 16C are schematic sectional views for illustrating a semiconductor nonvolatile memory element according to a seventh embodiment of the present invention.
Figure 16B:
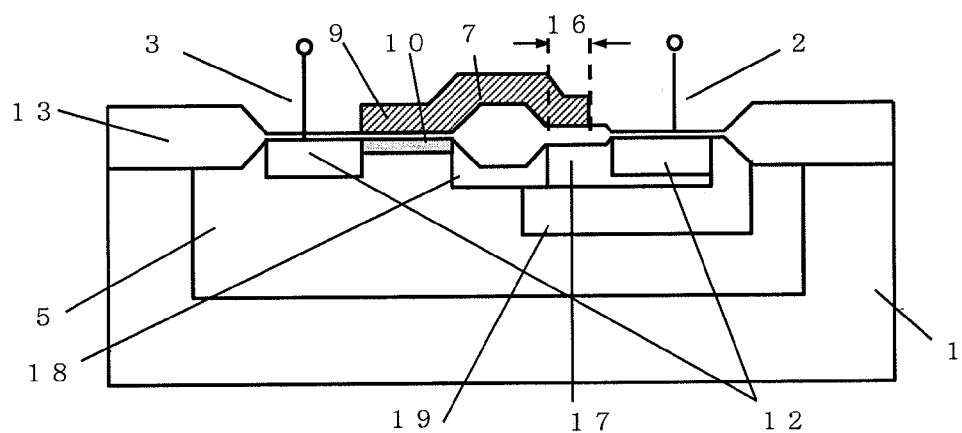
Figure 16C:
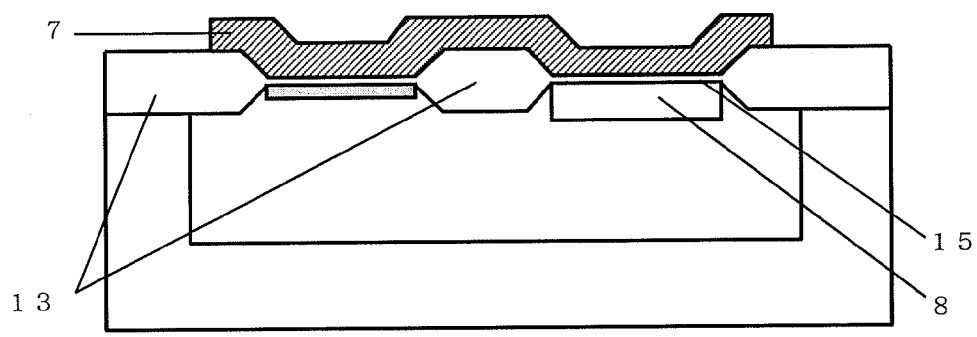

Further, FIG. 16A, FIG. 16B, and FIG. 16C are illustrations of a seventh embodiment of the present invention in which the two-layer gate electrode structure of polycrystalline silicon illustrated in FIG. 12 is changed to a single-layer structure, which has an effect that is similar to that of the fifth embodiment described with reference to FIG. 14A, FIG. 14B, and FIG. 14C. FIG. 16A is a plan view, and FIG. 16B and FIG. 16C are sectional views taken along the lines A-A' and B-B', respectively of FIG. 16A.

Figure 17A:
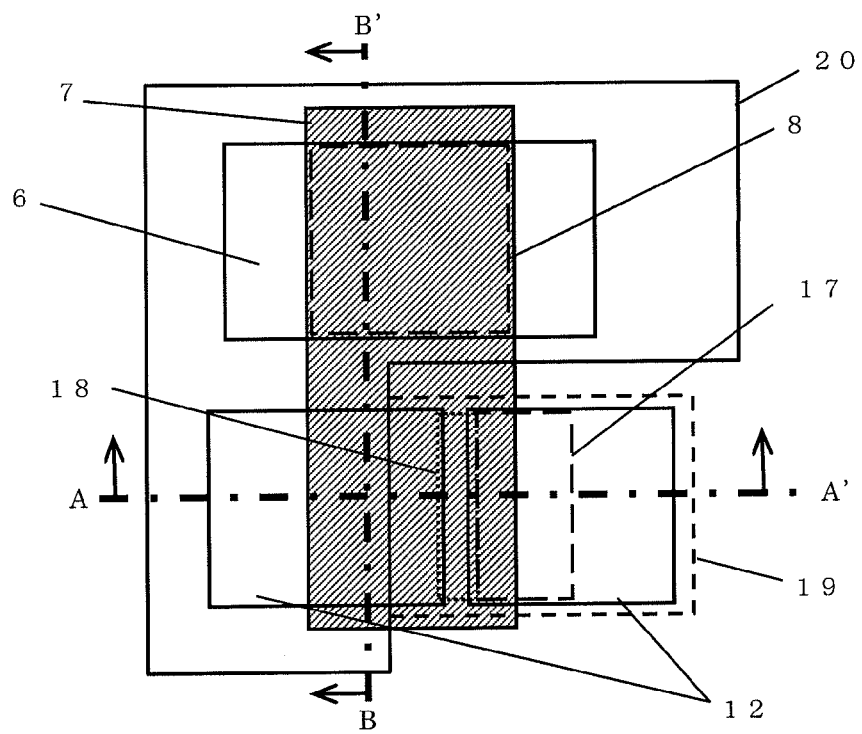
FIG. 17A, FIG. 17B, and FIG. 17C are schematic sectional views for illustrating a semiconductor nonvolatile memory element according to an eighth embodiment of the present invention.
Figure 17B:
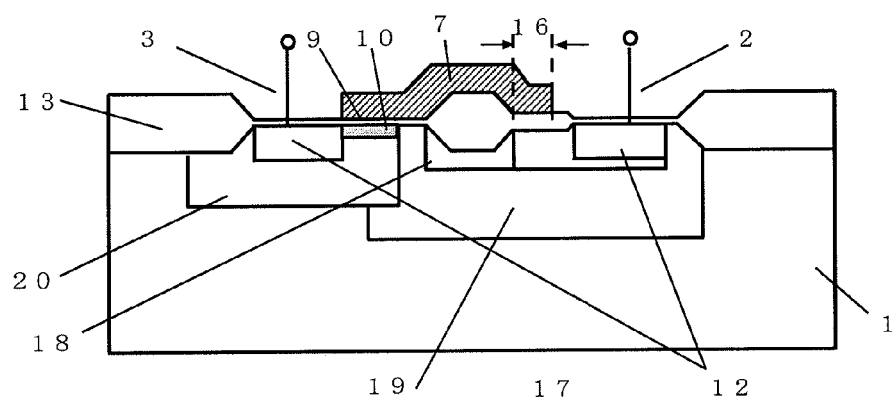
Figure 17C:
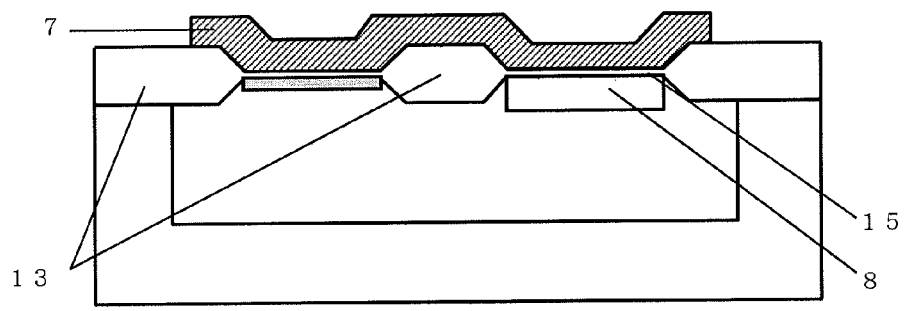

Further, FIG. 17A, FIG. 17B, and FIG. 17C are illustrations of an eighth embodiment of the present invention in which the two-layer gate electrode structure of polycrystalline silicon illustrated in FIG. 13 is changed to a single-layer structure, which has an effect that is similar to that of the fifth embodiment described with reference to FIG. 14A, FIG. 14B, and FIG. 14C. FIG. 17A is a plan view, and FIG. 17B and FIG. 17C are sectional views taken along the lines A-A' and B-B', respectively of FIG. 17A.

Next, the three kinds of gate insulating films used in the present invention are described.

First, it is desired that the second gate insulating film 14 used when carriers are injected into the floating gate electrode 7 using tunneling according to the present invention be a silicon oxide film formed by thermal oxidation that is excellent in film thickness controllability and film quality stability. Further, carriers are injected into the floating gate electrode 7 only once or several times in the testing step after the semiconductor manufacturing process ends, and thus, special conditions on the film formation and additional processing for the purpose of obtaining high resistance to repeated erasing and writing, are not necessary. Meanwhile, the second gate insulating film 14 is set to have a thickness that is large enough that a desired tunneling current value is obtained when a drain voltage is applied that is sufficiently higher than the operating voltage applied to the semiconductor integrated circuit device in the testing step after the semiconductor manufacturing process ends.

On the other hand, it is desired that the first gate insulating film 9 and the third gate insulating film 15 have a large capacitance value. This is for the purpose of, when the drain voltage is applied to inject holes into the floating gate electrode 7 in the testing step, sufficiently lowering the potential of the floating gate electrode 7 that is determined by capacitive coupling in order to efficiently apply a voltage to the second gate insulating film 14.

Figure 18:
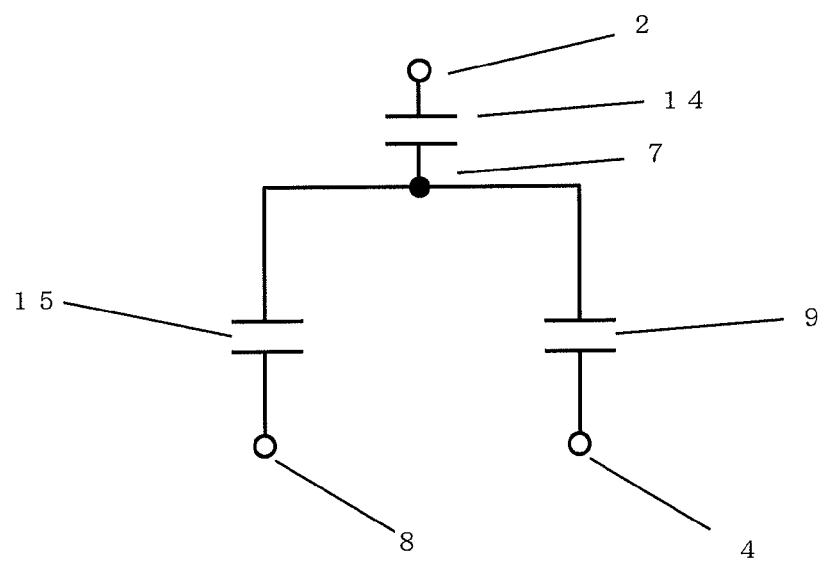
FIG. 18 is an equivalent circuit diagram of capacitances of gate insulating films when seen from a drain terminal according to the present invention.

An equivalent capacitive coupling circuit of the drain terminal 2 to which a high potential is applied, the control gate electrode 8 and the P-type well region 5 that are set to have a low potential, and the body terminal 4 at the same potential as that of the P-type well region 5 is as illustrated in FIG. 18. As can be seen from FIG. 18, by setting the first gate insulating film 9 and the third gate insulating film 15 to have a large capacitance and setting the ratio thereof to the capacitance of the second gate insulating film 14 having a small capacitance and having a large thickness to be large, the potential of the floating gate electrode 7 at an intermediate potential of the capacitive coupling is lowered. In this manner, a high voltage can be applied to the second gate insulating film 14 formed between the drain terminal 2 and the floating gate electrode 7, and thus, the tunneling can be promoted.

Accordingly, the first gate insulating film 9 and the third gate insulating film 15 are required to have a large electrode size when seen in a plan view. The reason is that the capacitance value can be large. It is sufficient that the first gate insulating film 9 and the third gate insulating film 15 have an area that is ten times or more as large as the area of the second gate insulating film 14 when seen in a plan view.

Further, for the purpose of having a large capacitance value, it is desired that the first gate insulating film 9 and the third gate insulating film 15 be as thin as possible. The floating gate electrode 7, the control gate electrode 8, and the P-type well region 5 are fixed to the same low potential in terms of the circuit, and thus, the insulating film thickness is not limited by the operating voltage of the semiconductor integrated circuit device. Accordingly, in the case of a thermal oxide film, taking into consideration leakage of carriers in the floating gate electrode 7 due to a high temperature environment, it is desired that the film thickness be from about 100 Å to about 200 Å.

Further, from the viewpoint of a large capacitance, it is desired that the first gate insulating film 9 and the third gate insulating film 15 have a relative permittivity that is as high as possible, which can be realized by using SiON, SiN, $HfO_2$, or the like rather than a silicon thermal oxide film. Characteristics such as a threshold voltage of films other than a silicon thermal oxide film generally fluctuate to a large extent due to instability of characteristics at a film interface. However, according to the present invention, even if there are variations in characteristics, the variations are adjusted finally by the regulation at the testing step, and thus, no problem arises.

Further, adopting the first gate insulating film 9 and the third gate insulating film 15 that are thin or that have a high relative permittivity has a strong point that the size thereof can be reduced and the costs can be reduced accordingly. Further, this method leads to increase in C as a capacitance value per unit area in the following general Expression (3), and thus, this method also has a strong point that the amount of fluctuations in threshold voltage can be lowered when Q reduces due to leakage of carriers in the floating gate electrode 7 or the like:

$$V = Q/C \quad (3)$$

As described above, by adopting the semiconductor nonvolatile memory element according to the present invention, the threshold voltage can be regulated with ease, the stability is high for a long time, and variations in circuit characteristics due to variations in element characteristics can be absorbed in electrical regulation in the testing step, and thus, a highly accurate semiconductor integrated circuit device can be provided.

Next, a method of manufacturing the semiconductor nonvolatile memory element having the structure according to the first embodiment illustrated in FIG. 10 is described with reference to FIG. 20A to FIG. 20D and FIG. 21E to FIG. 21H for illustrating process steps thereof.

Figure 20A:
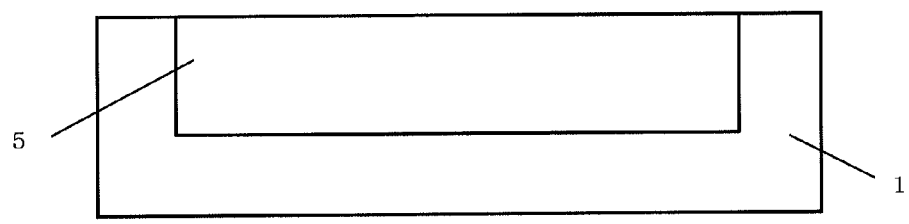
FIG. 20A, FIG. 20B, FIG. 20C, and FIG. 20D are sectional views for illustrating process steps for manufacturing the semiconductor nonvolatile memory element according to the first embodiment of the present invention.

First, the semiconductor substrate 1 of the P type or of the N type is prepared. After p-type impurities such as B or $BF_2$ are injected by ion injection into a region in which the semiconductor nonvolatile memory element is to be formed, thermal diffusion is performed to form the P-type well region 5 (FIG. 20A).

The polarity of the semiconductor substrate 1 is selected in accordance with a demand for the semiconductor integrated circuit device including the semiconductor nonvolatile memory element according to the present invention. Specifically, if the P-type well region 5 is required to be electrically isolated so that the potential of the P-type well region 5 is prevented from being the lowest potential on the semiconductor integrated circuit device, it is desired that the N-type semiconductor substrate 1 be prepared. However, if the P-type well region 5 has the lowest potential on the semiconductor integrated circuit device, a P-type semiconductor substrate that is less expensive can be used.

The amount of impurities to be injected and conditions on the thermal diffusion are selected so that the P-type well region 5 has an impurity concentration of from $7 \times 10^{15}/cm^3$ to $7 \times 10^{16}/cm^3$ and has a depth of from 6 μm to 10 μm. More specifically, the above-mentioned values are realized by an area density of impurity injection of $1 \times 10^{12}/cm^2$ to $1 \times 10^{13}/cm^2$ and by performing the thermal diffusion through heat treatment at from 1,100° C. to 1,200° C. for several hours to ten-odd hours.

Figure 20B:
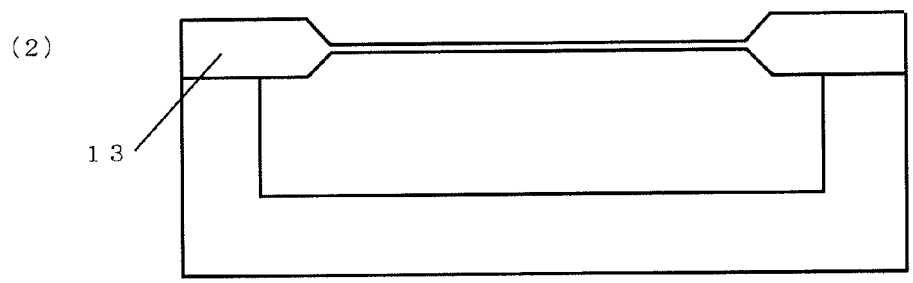

Next, for the purpose of electrically isolating elements from one another, LOCOS or the like is used to form the element isolation region 13 as a silicon oxide film around the P-type well region 5, and at the same time, a semiconductor nonvolatile memory element region surrounded by the element isolation region 13 is defined (FIG. 20B).

Figure 20C:
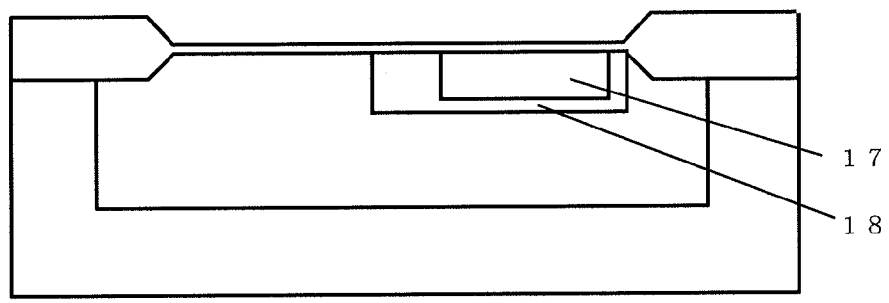

Then, N-type impurities of As or P are injected by ion injection into a region to be the drain region of the semiconductor nonvolatile memory element, to thereby form the N-type heavily doped impurity region 17 and the first N-type lightly doped impurity region 18 (FIG. 20C).

The N-type heavily doped impurity region 17 serves as the lower electrode for injecting, using tunneling, carriers such as electrons or holes into the floating gate electrode 7 thereabove via the silicon oxide film in a later stage. In order to inhibit depletion on the surface of the N-type heavily doped impurity region 17 when a high voltage on the positive side is applied in the carrier injection, it is desired that the N-type heavily doped impurity region 17 be formed through injection of As at an impurity concentration of $5 \times 10^{18}/cm^3$ or more. The injecting energy in this case is to the extent that enables the impurities to pass through the oxide film on a surface of the semiconductor substrate 1, and is, for example, about 100 keV.

Further, for the purpose of obtaining a drain breakdown voltage of a desired value or more, it is desired that the first N-type lightly doped impurity region 18 be formed by injecting P at an impurity concentration of $1 \times 10^{17}/cm^3$ or more and $1 \times 10^{18}/cm^3$ or less. Further, by setting the injecting energy to be 90 keV or more, the impurities can be diffused to a depth that is larger than that in the N-type heavily doped impurity region 17, and a PN junction breakdown voltage with the P-type well region 5 below the N-type heavily doped impurity region 17 can be set to be high.

Figure 20D:
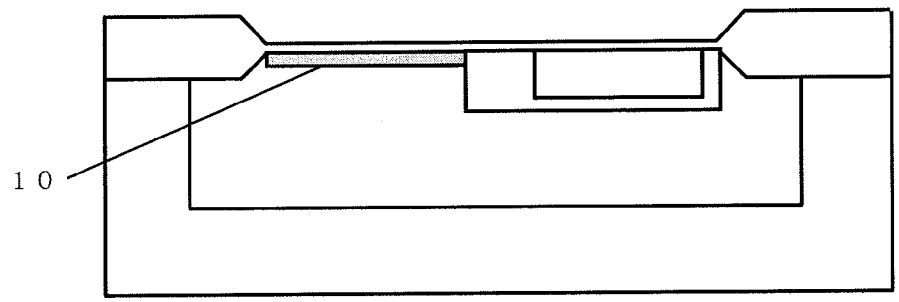

Next, for the purpose of manufacturing the semiconductor nonvolatile memory element as a normally on type depression type MOSFET, N-type impurities of As or P are injected by ion injection into a region in which the channel is to be formed so that the threshold voltage may have a desired negative value, to thereby form the N-type channel impurity region 10 (FIG. 20D).

Figure 21E:
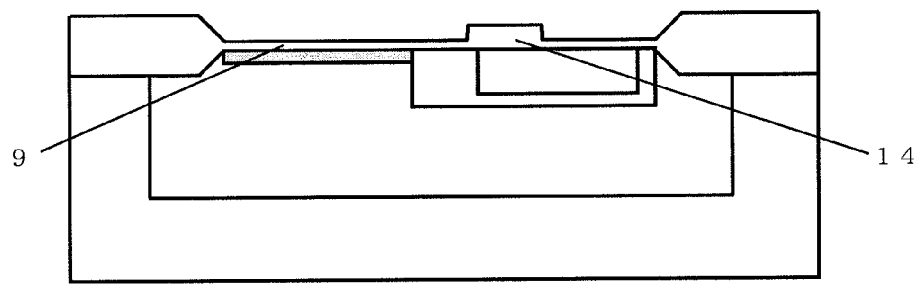
FIG. 21E, FIG. 21F, FIG. 21G, and FIG. 21H are sectional views for illustrating process steps for manufacturing the semiconductor nonvolatile memory element according to the first embodiment of the present invention, continued from FIG. 20D.

Then, by thermal oxidation, CVD, or the like, the first gate insulating film 9 having a thickness of from about 100 Å to about 200 Å is formed in the region in which the channel is to be formed, and the second gate insulating film 14 having a thickness of about several hundred angstroms that is larger than that of the first gate insulating film 9 is formed in a region in which the drain is to be formed (FIG. 21E).

The two gate insulating films having different thicknesses are realized as follows. First, the thicker second gate insulating film 14 is formed over an entire surface of the element region as a silicon oxide film by thermal oxidation, then, the second gate insulating film 14 in regions other than the region in which the drain is to be formed is removed by photolithography and etching using HF or the like. After that, the first gate insulating film 9 is formed as a silicon oxide film by thermal oxidation.

In this method, the second gate insulating film 14 is subjected to thermal oxidation when the first gate insulating film 9 is formed, and the silicon oxide film forming the second gate insulating film 14 is grown again. However, the second gate insulating film 14 already has a large thickness, and thus, when the first gate insulating film 9 serving as a thin gate insulating film undergoes the thermal oxidation to be formed, the speed of oxygen reaching silicon is slow, and the film thickness increases at a very low speed and the amount of the growth is small. Accordingly, the thickness of the second gate insulating film 14 after the thermal oxidation twice is dominantly affected by the first thermal oxidation, and the thickness can be easily predicted.

Figure 21F:
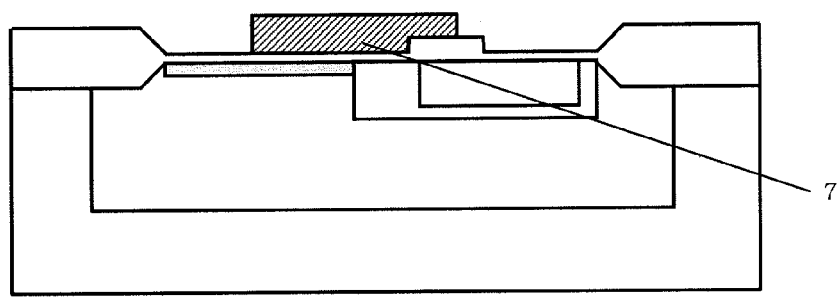

Then, a polycrystalline silicon layer is formed on the first gate insulating film 9 and the second gate insulating film 14, and impurities at a high concentration are injected by ion injection or thermal diffusion so that the concentration is $1 \times 10^{19}/cm^3$ or more, and then, photolithography and dry etching are performed to form the floating gate electrode 7 of the semiconductor nonvolatile memory element. At this time, the floating gate electrode 7 and the second gate insulating film 14 has an overlapping portion for the purpose of carrier injection using tunneling (FIG. 21F).

Figure 21G:
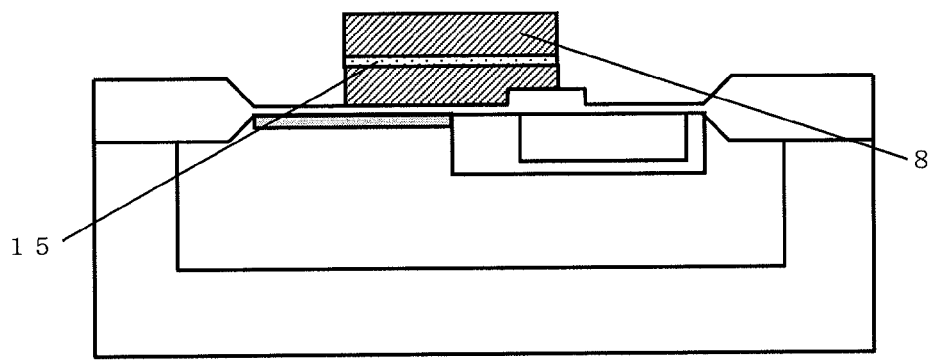

Then, an insulating film is formed by thermal oxidation, CVD, or the like on the floating gate electrode 7 of the semiconductor nonvolatile memory element for the purpose of forming the third gate insulating film 15. After that, a polycrystalline silicon layer is formed in succession, and impurities at a high concentration are injected by ion injection or thermal diffusion so that the concentration is $1 \times 10^{19}/cm^3$ or more, and then photolithography and dry etching are used to form the control gate electrode 8 by patterning (FIG. 21G).

In this case, the floating gate electrode 7 and the control gate electrode 8 may be collectively formed by performing photolithography and dry etching once. Specifically, a polycrystalline silicon layer is formed on the first gate insulating film 9 and the second gate insulating film 14, and impurities at a high concentration are injected by ion injection or thermal diffusion so that the concentration is $1 \times 10^{19}/cm^3$ or more. Then, the third gate insulating film 15 is formed in succession by thermal oxidation, CVD, or the like. Further, a polycrystalline silicon layer is formed in succession, and impurities at a high concentration are injected by ion injection or thermal diffusion so that the concentration is $1 \times 10^{19}/cm^3$ or more. After that, the control gate electrode 8 and the floating gate electrode 7 are collectively formed by patterning using photolithography and dry etching.

Figure 21H:
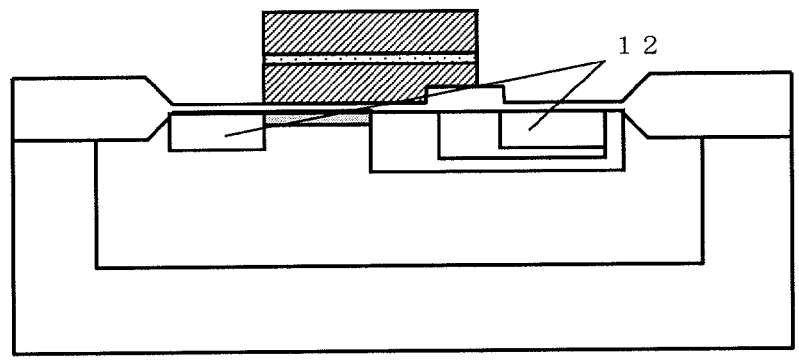

Then, in order to form the source/drain regions 12 of the semiconductor nonvolatile memory element, N-type impurities of As or P are injected by ion injection so that the concentration is $1 \times 10^{20}/cm^3$ or more (FIG. 21H).

The above description is made with reference to FIG. 20A to FIG. 20D and FIG. 21E to FIG. 21H for illustrating the process steps.

Then, an oxide film serving as an insulating film (not shown) is formed on an entire surface. After a contact hole is formed in a predetermined location, for the purpose of giving the gate potential, the source potential, the drain potential, and a body potential of the semiconductor nonvolatile memory element, metal wiring is formed by sputtering and patterning a metal film.

Note that, when the structure of the fifth embodiment described with reference to FIG. 14A, FIG. 14B, and FIG. 14C in which the two-layer gate electrode structure of polycrystalline silicon illustrated in FIG. 10 is changed to the single-layer structure is manufactured, the process steps up to the step of forming the floating gate electrode 7 on the first gate insulating film 9 and the second gate insulating film 14 illustrated in FIG. 21F are common to the manufacturing method described above. After this, the source/drain regions 12 of the semiconductor nonvolatile memory element are formed. In this way, the structure of the fifth embodiment can be similarly manufactured. The control gate electrode 8 can be formed using, for example, the impurities and the structure and the process step of the N-type heavily doped impurity region 17 in common.

Next, a method of manufacturing the semiconductor nonvolatile memory element having the structure according to the second embodiment illustrated in FIG. 11 is described with reference to FIG. 22A to FIG. 22D for illustrating process steps thereof. The second embodiment is different from the first embodiment in that the second N-type lightly doped impurity region 19 illustrated in FIG. 11 is additionally formed, and in FIG. 22A to FIG. 22D, process steps in a latter part are simplified accordingly.

Figure 22A:
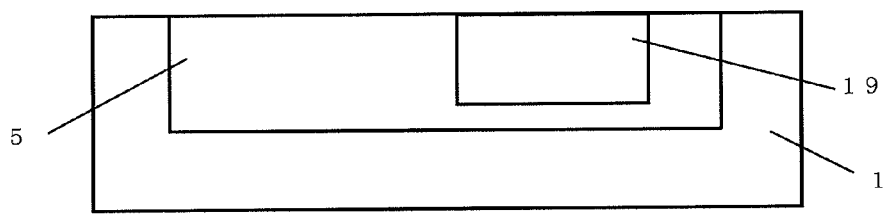
FIG. 22A, FIG. 22B, FIG. 22C, and FIG. 22D are sectional views for illustrating process steps for manufacturing the semiconductor nonvolatile memory element according to the second embodiment of the present invention.

First, the semiconductor substrate 1 of the P type or of the N type is prepared. The P-type well region 5 is formed in a region in which the semiconductor nonvolatile memory element is to be formed, and further, the second N-type lightly doped impurity region 19 is formed therein (FIG. 22A).

The amount of the impurities to be injected and conditions on the thermal diffusion of P-type impurities of B or $BF_2$ are selected so that the P-type well region 5 has an impurity concentration of from $7 \times 10^{15}/cm^3$ to $7 \times 10^{16}/cm^3$ and has a depth of from 6 μm to 10 μm. More specifically, the above-mentioned value is realized by an area density of impurity injection of from $1 \times 10^{12}/cm^2$ to $1 \times 10^{13}/cm^2$ and by performing the thermal diffusion through heat treatment at from 1,100° C. to 1,200° C. for several hours to ten-odd hours.

Further, the amount of impurities to be injected and conditions on the thermal diffusion of N-type impurities of P or As are selected so that the second N-type lightly doped impurity region 19 has an impurity concentration of from $2 \times 10^{16}/cm^3$ to $2 \times 10^{17}/cm^3$ and has a depth of from 3 μm to 6 μm. The thermal diffusion may be performed when the heat treatment is performed in forming the P-type well region 5, or, may be performed additionally thereafter.

Then, for the purpose of electrically isolating elements from one another, LOCOS or the like is used to form a silicon oxide film as the element isolation region 13, and at the same time, the semiconductor nonvolatile memory element region surrounded by the element isolation region 13 is defined (not shown).

Figure 22B:
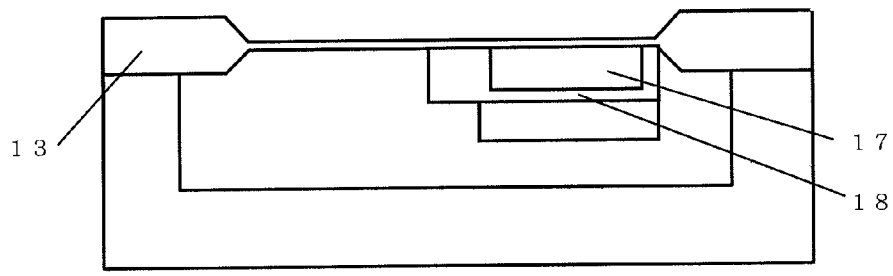

Then, N-type impurities of As or P are injected by ion injection into a region to be the drain region of the semiconductor nonvolatile memory element to form the N-type heavily doped impurity region 17 and the first N-type lightly doped impurity region 18 (FIG. 22B).

It is desired that the N-type heavily doped impurity region 17 be formed by injecting As at an impurity concentration of $5 \times 10^{18}/cm^3$ or more, and the injecting energy be about 100 keV so that the impurities can pass through the oxide film on the surface of the semiconductor substrate.

Further, it is desired that the first N-type lightly doped impurity region 18 be formed by injecting P at an impurity concentration of $1 \times 10^{17}/cm^3$ or more and $1 \times 10^{18}/cm^3$ or less. By setting the injecting energy to be 90 keV or more, the impurities can be diffused to a depth that is larger than that in the N-type heavily doped impurity region 17, and a PN junction breakdown voltage with the P-type well region 5 below the N-type heavily doped impurity region 17 can be set to be high.

After that, the N-type channel impurity region 10 is formed as described above with reference to FIG. 20D, and the first gate insulating film 9 and the second gate insulating film 14 are formed as described above with reference to FIG. 21E.

Figure 22C:
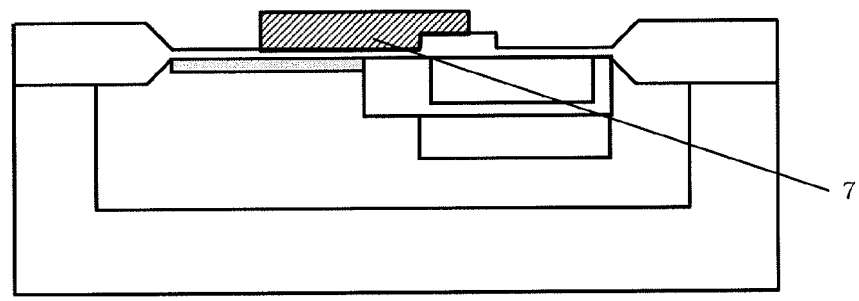

Then, FIG. 22A to FIG. 22D are referred to again. A polycrystalline silicon layer is formed on the first gate insulating film 9 and the second gate insulating film 14, and impurities at a high concentration are injected by ion injection or thermal diffusion so that the concentration is $1 \times 10^{19}/cm^3$ or more. Then, photolithography and dry etching are performed to form the floating gate electrode 7 of the semiconductor nonvolatile memory element (FIG. 22C).

Then, the third gate insulating film 15 and the floating gate electrode 7 are formed as described with reference to FIG. 21G.

Figure 22D:
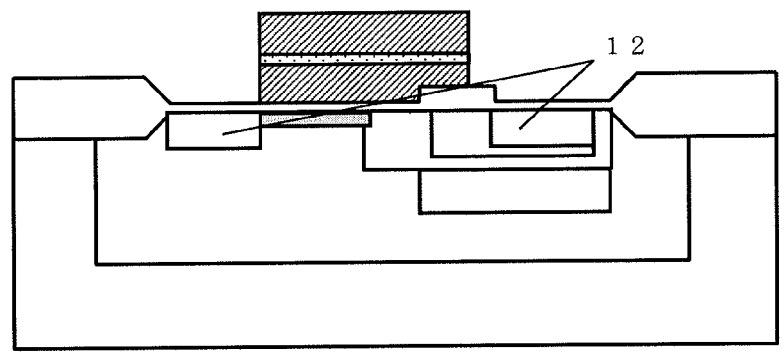

Then, in order to form the source/drain regions 12 of the semiconductor nonvolatile memory element, N-type impurities of As or P are injected by ion injection so that the concentration is $1 \times 10^{20}/cm^3$ or more (FIG. 22D).

Then, an oxide film serving as an insulating film (not shown) is formed on an entire surface. After a contact hole is formed in a predetermined location, for the purpose of giving the gate potential, the source potential, the drain potential, and the body potential of the semiconductor nonvolatile memory element, metal wiring is formed by sputtering and patterning a metal film.

Note that, when the structure of the sixth embodiment described with reference to FIG. 15A, FIG. 15B, and FIG. 15C in which the two-layer gate electrode structure of polycrystalline silicon illustrated in FIG. 11 is changed to the single-layer structure is manufactured, the process steps up to the step of forming the floating gate electrode 7 on the first gate insulating film 9 and the second gate insulating film 14 illustrated in FIG. 22C are common to the manufacturing method described above. After this, the source/drain regions 12 of the semiconductor nonvolatile memory element are formed. In this way, the structure of the sixth embodiment can be similarly manufactured. The control gate electrode 8 can be formed using, for example, the impurities and the structure and the process step of the N-type heavily doped impurity region 17 in common.

Next, a method of manufacturing the semiconductor nonvolatile memory element having the structure according to the third embodiment illustrated in FIG. 12 is described with reference to FIG. 23A to FIG. 23D, and FIG. 24E and FIG. 24F for illustrating process steps thereof.

Figure 23A:
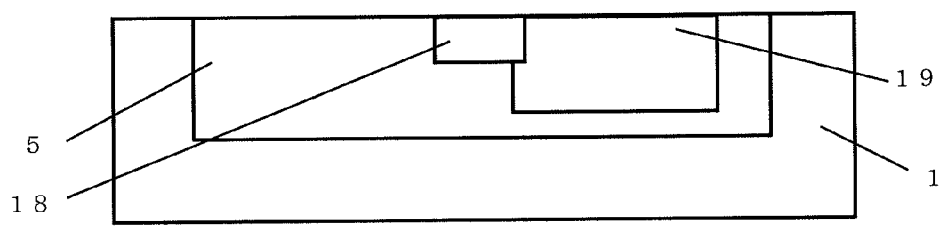
FIG. 23A, FIG. 23B, FIG. 23C, and FIG. 23D are sectional views for illustrating process steps for manufacturing the semiconductor nonvolatile memory element according to the third embodiment of the present invention.

First, the semiconductor substrate 1 of the P type or of the N type is prepared. The P-type well region 5 is formed in a region in which the semiconductor nonvolatile memory element is to be formed, and further, the second N-type lightly doped impurity region 19 and the first N-type lightly doped impurity region 18 are formed therein. The P-type well region 5 and the second N-type lightly doped impurity region 19 are formed as described in the manufacturing method for the second embodiment. The first N-type lightly doped impurity region 18 is formed to have the impurity concentration of the N-type impurities of As or P that is adjusted to be from $1 \times 10^{17}/cm^3$ to $1 \times 10^{18}/cm^3$. The first N-type lightly doped impurity region 18 is formed in advance so as to underlie the thick oxide film 13 to be formed adjacent to the N-type channel impurity region 10 (FIG. 23A).

Figure 23B:
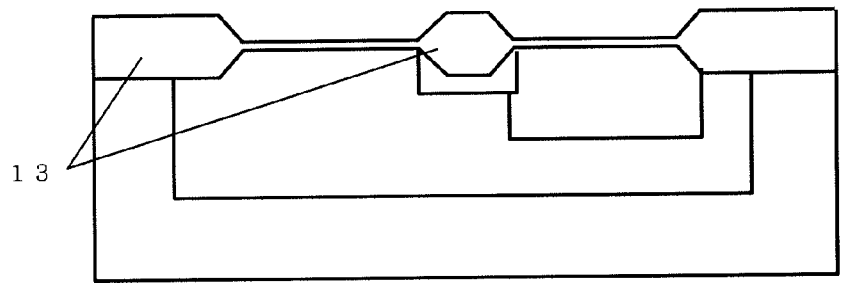

Then, for the purpose of electrically isolating elements from one another, LOCOS is used to form the element isolation region 13, and then, the thick oxide film 13 is formed on the first N-type lightly doped impurity region 18. It is preferred that the thick oxide film 13 formed on the first N-type lightly doped impurity region 18 have a thickness of 1,000 Å or more. As described with reference to FIG. 12, the thick oxide film 13 may be formed simultaneously with the LOCOS oxide film 13 in the element isolation region to prevent increase in the number of process steps (FIG. 23B).

Figure 23C:
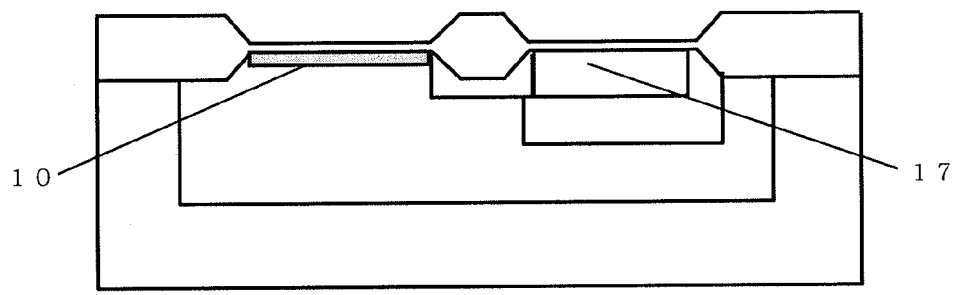

Then, N-type impurities of As or P are injected by ion injection into a region to be the drain region of the semiconductor nonvolatile memory element to form the N-type heavily doped impurity region 17. Next, for the purpose of manufacturing the semiconductor nonvolatile memory element as a normally on type depression type MOSFET, N-type impurities of As or P are injected by ion injection into a region in which the channel is to be formed to form the N-type channel impurity region 10 (FIG. 23C).

Figure 23D:
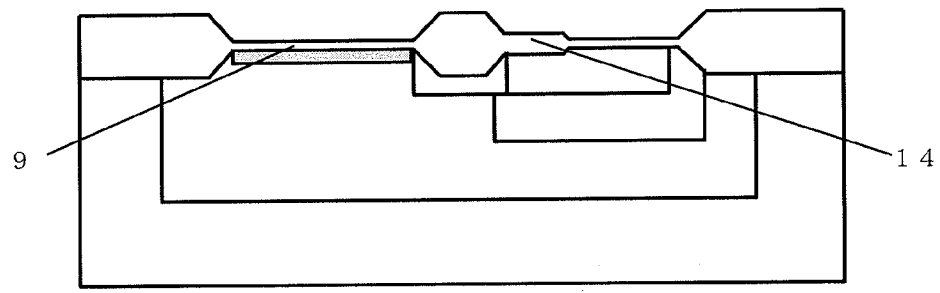

Then, by thermal oxidation, CVD, or the like, the second gate insulating film 14 having a thickness that is larger than that of the first gate insulating film 9 is formed in a part of the region in which the drain is to be formed on the N-type heavily doped impurity region 17 so as to be in contact with the LOCOS oxide film 13 formed prior thereto. Then, the first gate insulating film 9 is formed on the region in which the channel is to be formed. The two gate insulating films having different thicknesses are realized as described with reference to FIG. 21E. First, the thicker second gate insulating film 14 is formed. Then, the second gate insulating film 14 in regions other than the region in which the drain is to be formed is removed by photolithography and etching using HF or the like, and then, the first gate insulating film 9 is formed (FIG. 23D).

Figure 24E:
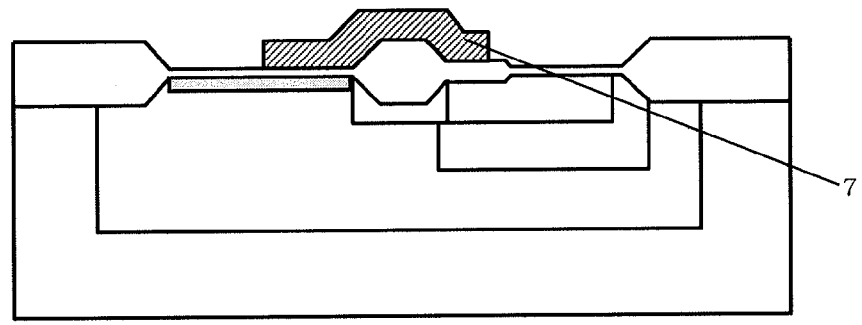
FIG. 24E and FIG. 24F are sectional views for illustrating process steps for manufacturing the semiconductor nonvolatile memory element according to the third embodiment of the present invention, continued from FIG. 23D.

Then, a polycrystalline silicon layer is formed on the first gate insulating film 9 and the second gate insulating film 14, and impurities at a high concentration are injected by ion injection or thermal diffusion so that the concentration is $1 \times 10^{19}/cm^3$ or more. Then, photolithography and dry etching are performed to form the floating gate electrode 7 of the semiconductor nonvolatile memory element. At this time, the floating gate electrode 7 and the second gate insulating film 14 has an overlapping portion for the purpose of carrier injection using tunneling (FIG. 24E).

Then, the third gate insulating film 15 and the control gate electrode 8 are formed as described with reference to FIG. 21G (not shown).

Figure 24F:
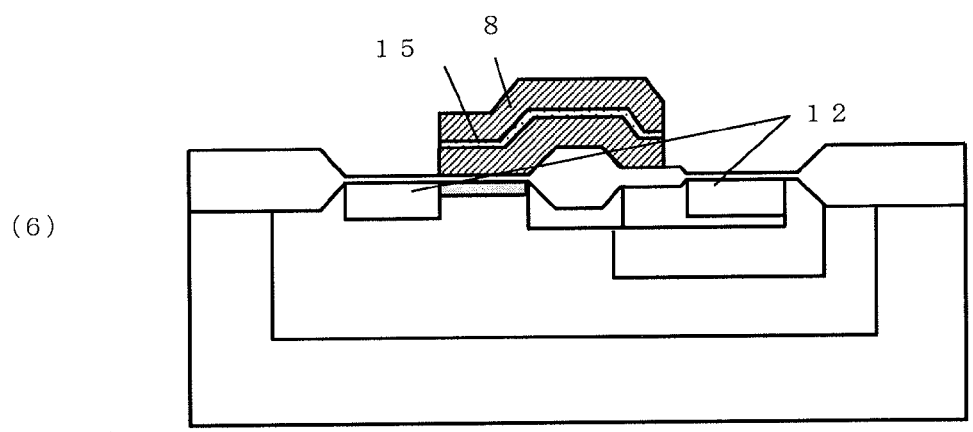

Then, in order to form the source/drain regions 12 of the semiconductor nonvolatile memory element, N-type impurities of As or P are injected by ion injection so that the concentration is $1 \times 10^{20}/cm^3$ or more (FIG. 24F).

The above description is made with reference to FIG. 23A to FIG. 23D, and FIG. 24E and FIG. 24F for illustrating the process steps.

Then, an oxide film serving as an insulating film (not shown) is formed on an entire surface. After a contact hole is formed in a predetermined location, for the purpose of giving the gate potential, the source potential, the drain potential, and the body potential of the semiconductor nonvolatile memory element, metal wiring is formed by sputtering and patterning a metal film.

Note that, when the structure of the seventh embodiment described with reference to FIG. 16A, FIG. 16B, and FIG. 16C in which the two-layer gate electrode structure of polycrystalline silicon illustrated in FIG. 12 is changed to the single-layer structure is manufactured, the process steps up to the step of forming the floating gate electrode 7 on the first gate insulating film 9 and the second gate insulating film 14 illustrated in FIG. 24E are common to the manufacturing method described above. After this, the source/drain regions 12 of the semiconductor nonvolatile memory element are formed. In this way, the structure of the seventh embodiment can be similarly manufactured. The control gate electrode 8 can be formed using, for example, the impurities and the structure and the process step of the N-type heavily doped impurity region 17 in common.

Next, a method of manufacturing the semiconductor nonvolatile memory element having the structure according to the fourth embodiment illustrated in FIG. 13 is described with reference to FIG. 25A to FIG. 25D for illustrating process steps thereof.

Figure 25A:
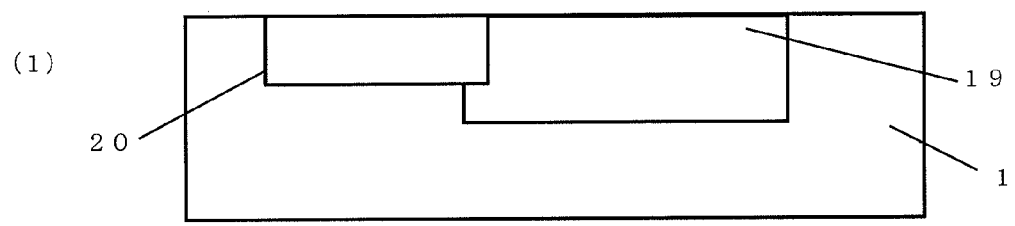
FIG. 25A, FIG. 25B, FIG. 25C, and FIG. 25D are sectional views for illustrating process steps for manufacturing the semiconductor nonvolatile memory element according to the fourth embodiment of the present invention.

First, the semiconductor substrate 1 of the P type or of the N type is prepared. The P-type lightly doped impurity region 20 and the second N-type lightly doped impurity region 19 are formed in a region in which the semiconductor nonvolatile memory element is to be formed so as to partially overlap each other. The amount of impurities to be injected and conditions on the thermal diffusion of N-type impurities of P or As are selected so that the second N-type lightly doped impurity region 19 has an impurity concentration of from $2 \times 10^{16}/cm^3$ to $2 \times 10^{17}/cm^3$ and has a depth of from 3 µm to 6 µm. The P-type lightly doped impurity region 20 of B or $BF_2$ has, as described with reference to FIG. 13, an impurity concentration of from about $2 \times 10^{16}/cm^3$ to about $2 \times 10^{17}/cm^3$, which is the impurity concentration higher than that of the second N-type lightly doped impurity region 19, thereby seeking improvement in the drain breakdown voltage (FIG. 25A).

Then, the first N-type lightly doped impurity region 18 is formed in a region in which the drain is to be formed to have the impurity concentration of N-type impurities of As or P that is adjusted to be from $1\times10^{17}/cm^3$ to $1\times10^{18}/cm^3$ (not shown).

Figure 25B:
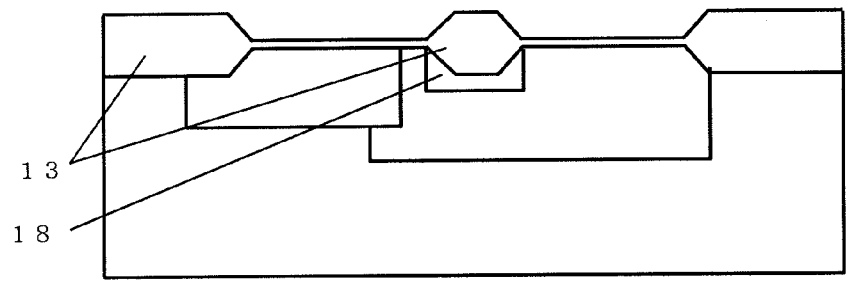

Then, for the purpose of electrically isolating elements from one another, LOCOS is used to form the element isolation region 13, and then, the thick oxide film 13 is formed on the first N-type lightly doped impurity region 18. It is preferred that the thick oxide film 13 formed on the first N-type lightly doped impurity region 18 have a thickness of 1,000 Å or more. As described with reference to FIG. 12, the thick oxide film 13 may be formed simultaneously with the LOCOS oxide film 13 in the element isolation region to prevent increase in the number of process steps (FIG. 25B).

Then, the N-type channel impurity region 10, the first gate insulating film 9, and the second gate insulating film 14 are formed (not shown).

Figure 25C:
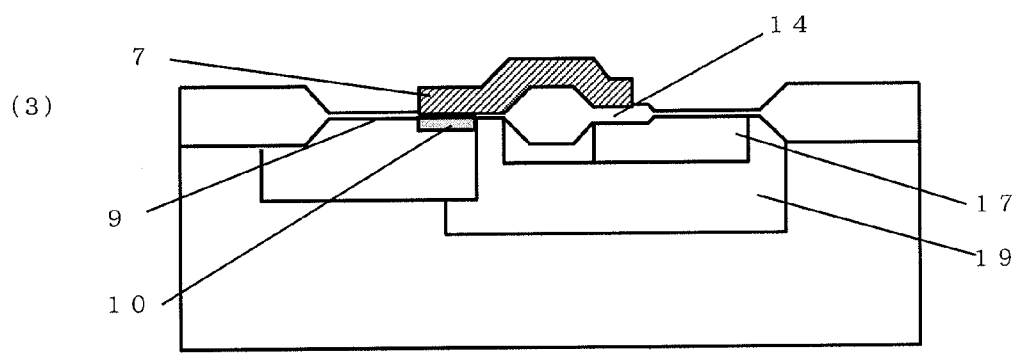

Then, a polycrystalline silicon layer is formed on the first gate insulating film 9 and the second gate insulating film 14, and impurities at a high concentration are injected by ion injection or thermal diffusion so that the concentration is $1\times10^{19}/cm^3$ or more. Then, photolithography and dry etching are performed to form the floating gate electrode 7 of the semiconductor nonvolatile memory element (FIG. 25C).

Then, the third gate insulating film 15 and the control gate electrode 8 are formed (not shown).

Figure 25D:
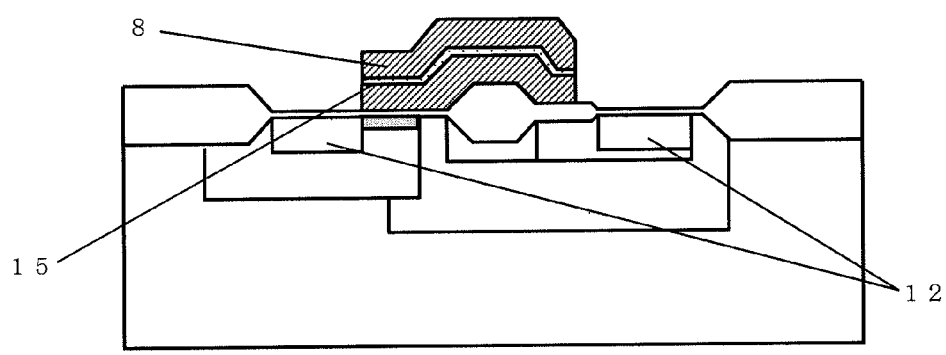

Then, in order to form the source/drain regions 12 of the semiconductor nonvolatile memory element, N-type impurities of As or P are injected by ion injection so that the concentration is $1\times10^{20}/cm^3$ or more (FIG. 25D).

Then, an oxide film serving as an insulating film (not shown) is formed on an entire surface. After a contact hole is formed in a predetermined location, for the purpose of giving the gate potential, the source potential, the drain potential, and the body potential of the semiconductor nonvolatile memory element, metal wiring is formed by sputtering and patterning a metal film.

Note that, when the structure of the eighth embodiment described with reference to FIG. 17A, FIG. 17B, and FIG. 17C in which the two-layer gate electrode structure of polycrystalline silicon illustrated in FIG. 13 is changed to the single-layer structure is manufactured, the process steps up to the step of forming the floating gate electrode 7 on the first gate insulating film 9 and the second gate insulating film 14 illustrated in FIG. 25C are common to the manufacturing method described above. After this, the source/drain regions 12 of the semiconductor nonvolatile memory element are formed. In this way, the structure of the eighth embodiment can be similarly manufactured. The control gate electrode 8 can be formed using, for example, the impurities and the structure and the process step of the N-type heavily doped impurity region 17 in common.

By the way, in the manufacturing methods of the first to fourth embodiments described above, the first insulating film 9 and the second insulating film 14 are formed in the same way. This is referred to as a first manufacturing method of forming the gate insulating films. Instead of the first method, the following second to fifth methods can be adopted for the purpose of improving the performance, reducing costs, or the like.

The second method is different from the first method in that the three steps of forming a thick oxide film, partly removing the oxide film, and forming a thin oxide film are not used, but the first gate insulating film 9 and the second gate insulating film 14 having different thicknesses are simultaneously formed by performing thermal oxidation once.

Figure 26A:
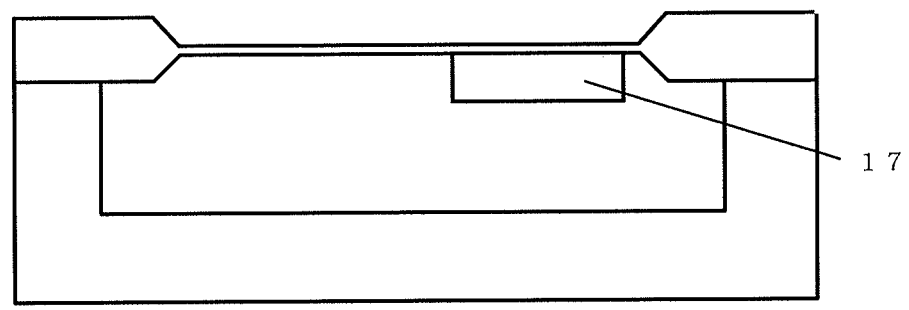
FIG. 26A and FIG. 26B are sectional views for illustrating a second group of process steps for manufacturing a first gate insulating film and a second gate insulating film of the semiconductor nonvolatile memory element according to the present invention.

Specifically, as illustrated in FIG. 26A, first, the N-type heavily doped impurity region 17 is formed at a high impurity concentration of $1\times10^{19}/cm^3$ or more using As.

Figure 26B:
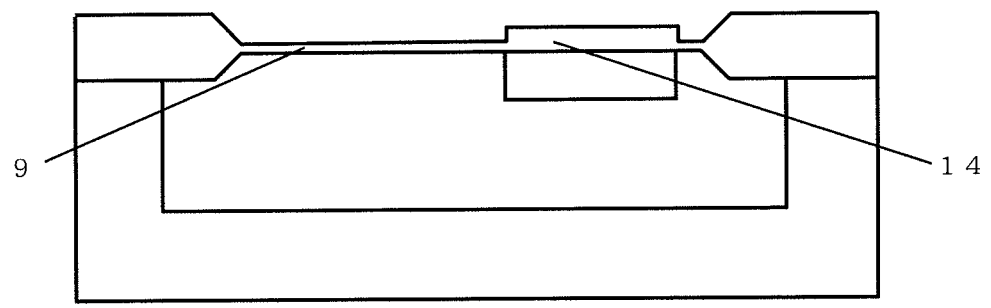

Then, a gate insulating film is formed by wet oxidation using water vapor, or pyrogenic oxidation in which oxygen gas and hydrogen gas are introduced into a furnace to be reacted with each other. The gate insulating film has a large thickness only on the N-type heavily doped impurity region 17 due to an enhanced oxidation effect and has a small thickness in a remaining region, and thus, a shape illustrated in FIG. 26B is obtained.

In this case, for example, when the first gate insulating film 9 has a thickness of 150 Å, the second gate insulating film 14 can have a thickness of about 300 Å. As the extent of a lattice defect in the semiconductor substrate 1 becomes larger, the effect of the enhanced oxidation becomes more remarkable due to entrance of oxygen and reaction. Thus, regardless of whether the impurities are of the N type or of the P type, when the impurity concentration in the semiconductor substrate 1 is high, the effect of the enhanced oxidation can be obtained in accordance with the extent of the lattice defect. However, when the film is used as a gate insulating film in particular, an oxide film that is grown on an impurity region of the N type is desired. Accordingly, this method can be said to be effective in an N-channel type semiconductor nonvolatile memory element. In this case, P-type impurities are not preferred because the P-type impurities enter the oxide film during the thermal oxidation to considerably lower the quality of the oxide film.

The method described above has effects that, by reducing the three steps to one step, costs can be reduced and time taken for the step can be shortened.

Next, the third method of forming the first gate insulating film 9 and the second gate insulating film 14 is described with reference to FIG. 27A to FIG. 27C.

Figure 27A:
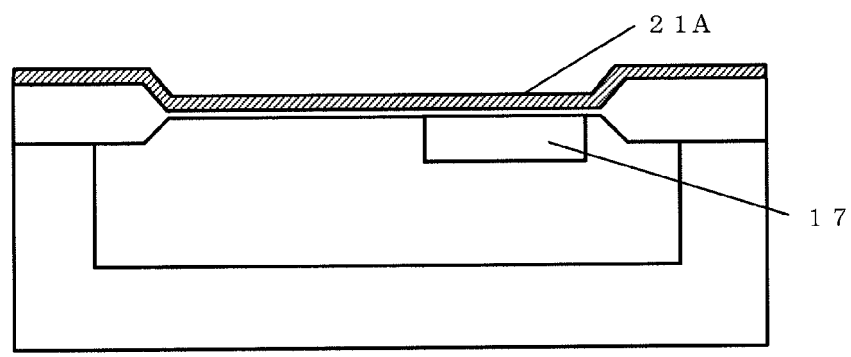
FIG. 27A, FIG. 27B, and FIG. 27C are sectional views for illustrating a third group of process steps for manufacturing the first gate insulating film and the second gate insulating film of the semiconductor nonvolatile memory element according to the present invention.

In the third method, first, a polycrystalline silicon layer 21A having a thickness of from 100 Å to 400 Å is formed in advance on an entire surface (FIG. 27A).

Figure 27B:
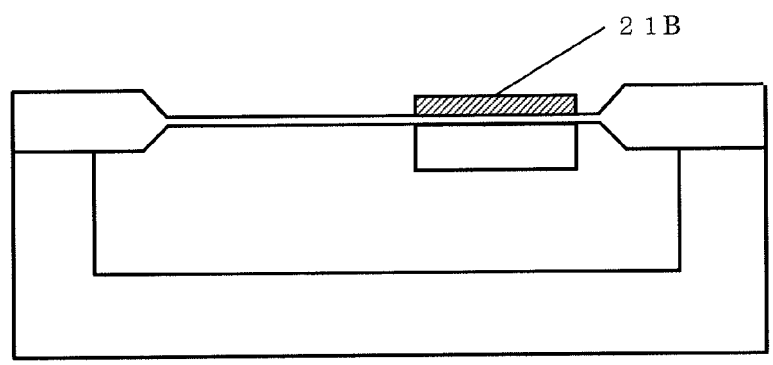
Figure 27C:
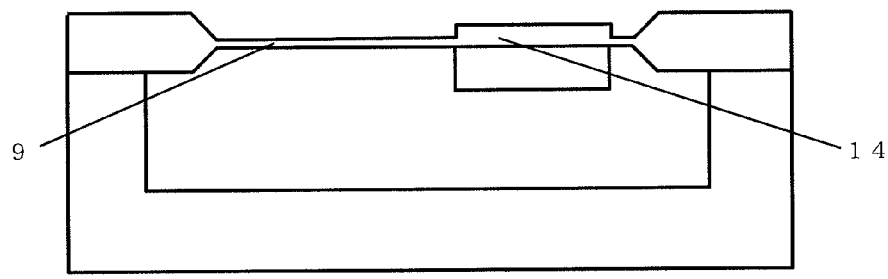

Then, the polycrystalline silicon layer 21A in regions other than a region in which the second gate insulating film 14 is to be formed is removed by photolithography and etching, and a polycrystalline silicon layer 21B is left (FIG. 27B).

Then, the resultant is subjected to thermal oxidation for forming the first gate insulating film 9, and a silicon oxide film (9 and 14) is formed on the semiconductor substrate 1. At that time, by setting the second gate insulating film 14 to have a thickness so that the polycrystalline silicon layer 21B is completely oxidized by the thermal oxidation for forming the first gate insulating film 9, the second gate insulating film 14 may be formed of the oxide film formed by oxidizing polycrystalline silicon. In this case, polycrystalline silicon is used because, due to a lattice defect included therein, the oxidation speed can be 1.5 to 2 times as high as that of ordinary monocrystalline silicon (FIG. 27C).

The third method is different from the first method in that the need for long-time high-temperature heat treatment for forming the thick second gate insulating film 14 is eliminated, and thus, has effects that variations in impurities at a relatively low concentration in the N-type channel impurity region 10, the first N-type lightly doped impurity region 18, or the second N-type lightly doped impurity region 19 due to heat treatment at high temperature are inhibited and higher accuracy of element characteristics is promoted.

Figure 28A:
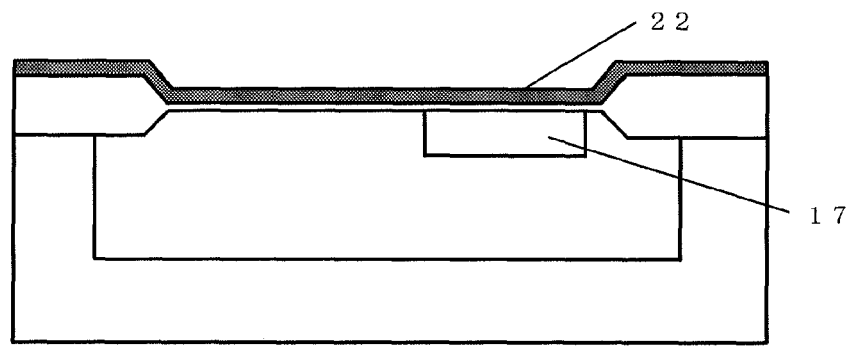
FIG. 28A, FIG. 28B, and FIG. 28C are sectional views for illustrating a fourth group of process steps for manufacturing the first gate insulating film and the second gate insulating film of the semiconductor nonvolatile memory element according to the present invention.

Next, the fourth method is described with reference to FIG. 28A to FIG. 28C. First, an underlayer silicon oxide film having a thickness of from 10 Å to 100 Å is formed in advance on an entire surface by thermal oxidation, and then, a SiN layer 22 having a thickness of from 100 Å to 200 Å is formed on an entire upper surface of the underlayer silicon oxide film by LPCVD or the like (FIG. 28A).

Figure 28B:
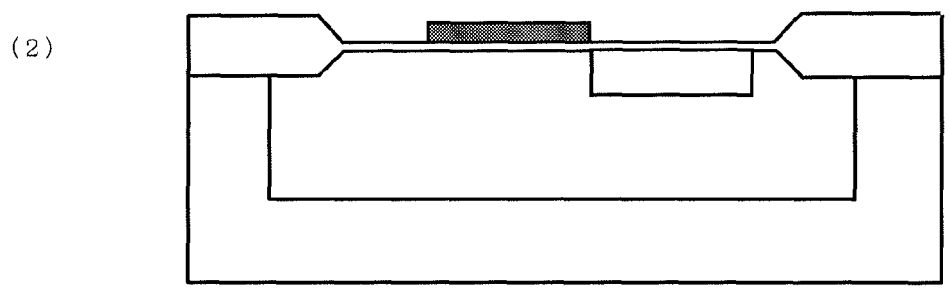
Figure 28C:
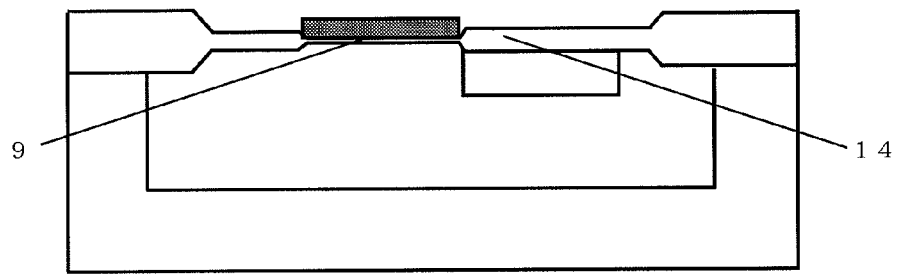

Then, the SiN layer 22 in regions other than a region in which the first gate insulating film 9 is to be formed is removed by photolithography (FIG. 28B).

Then, on the resultant silicon oxide film having a thickness of several hundred angstroms for forming the second gate insulating film 14 is formed by thermal oxidation. At that time, the first gate insulating film 9 is covered with SiN having a low reactivity, and thus, the oxide film is scarcely grown thereon. Accordingly, the first gate insulating film 9 can be formed as a stacked film including the silicon oxide film having a thickness of several ten angstromes and the SiN film having a thickness of from 100 Å to 200 Å, and the second gate insulating film 14 can be formed as a silicon film having a thickness of several hundred angstromes (FIG. 28C).

The fourth method has strong points that the first gate insulating film 9 can have a large capacitance, the size of the gate electrode 8 can be reduced and costs can be reduced accordingly, and the amount of variations in threshold voltage can be small even when the charge Q is reduced due to leakage of carriers in the floating gate electrode 7, or the like.

Figure 29A:
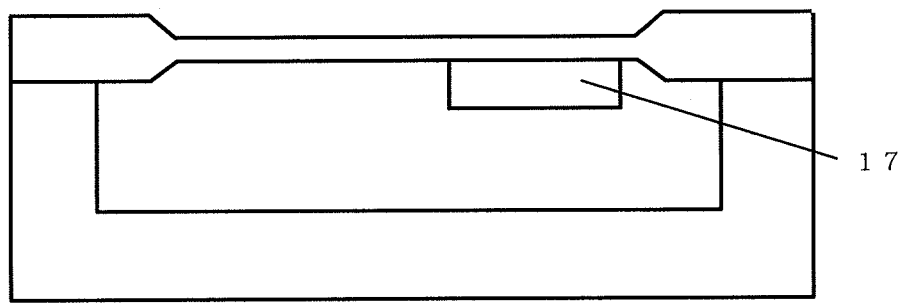
FIG. 29A, FIG. 29B, FIG. 29C, and FIG. 29D are sectional views for illustrating a fifth group of process steps for manufacturing the first gate insulating film and the second gate insulating film of the semiconductor nonvolatile memory element according to the present invention.

Next, the fifth method is described with reference to FIG. 29A to FIG. 29D. First, similarly to the case of the first method, the second gate insulating film 14 having a thickness of from 100 Å to 1,000 Å is formed on an entire surface as a silicon oxide film by thermal oxidation (FIG. 29A).

Figure 29B:
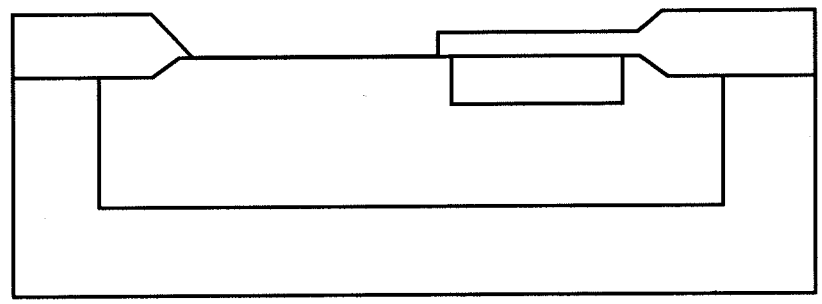

Then, similarly to the case of the first method, the second gate insulating film 14 in a region in which the channel is to be formed is removed by photolithography and etching (FIG. 29B).

Figure 29C:
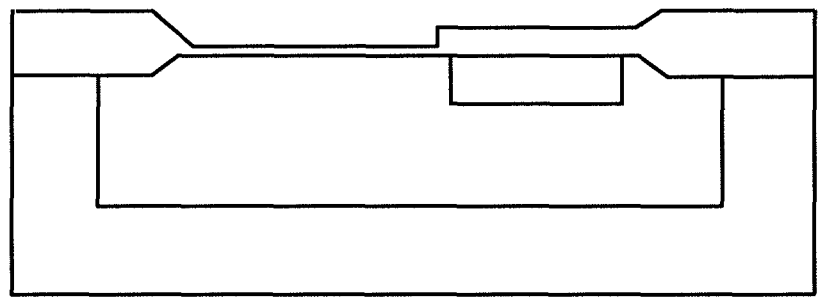

Then, the first gate insulating film 9 is formed by thermal oxidation. According to this method, the thickness of the first gate insulating film 9 is smaller than that in the first method, and is from 30 Å to 100 Å (FIG. 29C).

Figure 29D:
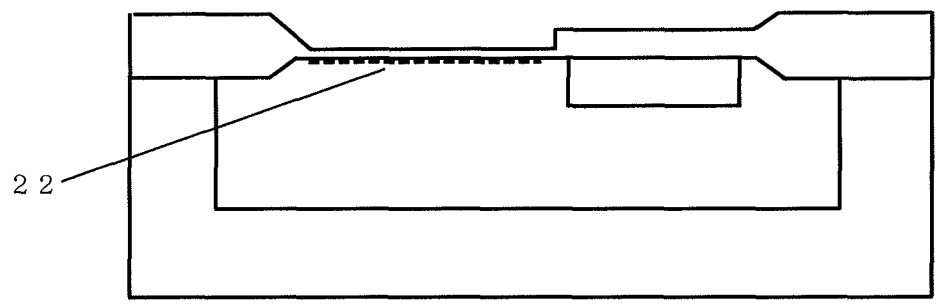

Then, thermal nitridation is performed in an atmosphere of ammonia at a temperature that is equal to or higher than 1,000° C. Then, nitrogen is diffused to an interface with the semiconductor substrate 1 under the first gate insulating film 9 to react with the semiconductor substrate 1, and a SiN layer having a thickness of from about 1 Å to about 20 Å is formed. On the other hand, the second gate insulating film 14 has a sufficiently large thickness, and thus, the amount of nitrogen that is diffused to reach the interface with the semiconductor substrate 1 is very small. Thus, the extent of insulation of the formed SiN layer is not large enough to prevent tunneling of the carriers (FIG. 29D).

The silicon oxide film that forms the first gate insulating film 9 according to the fifth method has a small thickness of 100 Å or less, and thus, the carriers may dissipate in the floating gate electrode 7 due to a leakage current at high temperature. However, the SiN layer under the oxide film ensures a large extent of insulation, and thus, the leakage is inhibited, and at the same time, a large capacitance of the first gate insulating film 9 is realized as well.

The SiN layer is formed in the fourth method as well. However, when CVD is used as in the fourth method, controllability of a film thickness of 100 Å or less is not satisfactory, and there is a problem in that the element characteristics vary. Thermal nitridation as in the fifth method can form a thinner SiN layer with stability, which is effective for more highly accurate element characteristics.

The present invention is applicable to products other than a step-down series regulator and a voltage detector described above. Through adoption of a memory terminal in which the threshold voltage can be changed with an electrical signal that is input from an input terminal for regulation, an output voltage can be changed with an input electrical signal in various semiconductor integrated circuit devices including a reference voltage circuit. It goes without saying that the present invention is applicable to products other than a power management IC.

What is claimed is:
1. A semiconductor nonvolatile memory element, comprising:
   a semiconductor substrate;
   a well region of a first conductivity type formed in the semiconductor substrate;
   a heavily doped source region and a first heavily doped drain region which are formed in the well region so as to be apart from each other, and each of which contains high-concentration impurities of a second conductivity type;
   a first gate insulating film formed on the semiconductor substrate between the heavily doped source region and the first heavily doped drain region so as to be adjacent to the heavily doped source region;
   a second gate insulating film formed on the semiconductor substrate between the heavily doped source region and the first heavily doped drain region so as to be adjacent to the first heavily doped drain region;
   a second heavily doped drain region of the second conductivity type formed apart from the heavily doped source region, the second heavily doped drain region including a region under the second gate insulating film and being formed in a region that overlaps the first heavily doped drain region;
   a first lightly doped drain region of the second conductivity type formed apart from the heavily doped source region, the first lightly doped drain region including a region under the first gate insulating film and the region under the second gate insulating film and being formed in a region that overlaps the first heavily doped drain region and the second heavily doped drain region;
   a channel impurity region of the second conductivity type formed under the first gate insulating film between the heavily doped source region and the first lightly doped drain region;
   a floating gate electrode that is made of polycrystalline silicon containing high-concentration impurities, and is formed on the first gate insulating film and the second gate insulating film;
   a third gate insulating film formed on the floating gate electrode; and
   a control gate electrode that is made of polycrystalline silicon containing high-concentration impurities, formed on the third gate insulating film,
   wherein the second gate insulating film has a thickness that is larger than a thickness of the first gate insulating film, and
   wherein the well region includes the heavily doped source region, the first heavily doped drain region, the second heavily doped drain region, the first lightly doped drain region, and the channel impurity region, and is formed to a depth that is larger than depths of the heavily doped source region, the first heavily doped drain region, the second heavily doped drain region, the first lightly doped drain region, and the channel impurity region.

2. A semiconductor nonvolatile memory element according to claim 1, further comprising a second lightly doped drain region formed in a region including the first heavily doped drain region, the second heavily doped drain region, and a part of the first lightly doped drain region to a depth that is larger than the depth of the first lightly doped drain region.

3. A semiconductor nonvolatile memory element according to claim 2, further comprising an insulating film formed on a region including a part of the first lightly doped drain region between the first gate insulating film and the second gate insulating film, the insulating film having a thickness that is larger than the thickness of the first gate insulating film and the thickness of the second gate insulating film.

4. A semiconductor nonvolatile memory element according to claim 3,
wherein the second lightly doped drain region is formed in a region including the second heavily doped drain region and the first lightly doped drain region, and
wherein the well region includes the heavily doped source region and the channel impurity region, and has an impurity concentration that is higher than an impurity concentration of the second lightly doped drain region.

5. A semiconductor nonvolatile memory element according to claim 2, wherein impurities in the second lightly doped drain region comprise one of As and P at an impurity concentration of $2 \times 10^{16}/cm^3$ or more and $2 \times 10^{17}/cm^3$ or less.

* * * * *